(12) United States Patent  
Burger et al.

(10) Patent No.: US 9,322,861 B2
(45) Date of Patent: Apr. 26, 2016

(54) METHOD AND SENSOR DEVICE FOR THE DETECTION OF A GRIPPING OF A HAND-HELD DEVICE

(75) Inventors: Stefan Burger, München (DE); Andreas Dorfner, München (DE); Holger Erkens, Düsseldorf (DE); Claus Kaltner, Dachau (DE); Holger Steffens, München (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 253 days.

(21) Appl. No.: 13/883,757

(22) PCT Filed: Nov. 7, 2011

(86) PCT No.: PCT/EP2011/069567
§ 371 (c)(1),
(2), (4) Date: Dec. 23, 2013

(87) PCT Pub. No.: WO2012/059601
PCT Pub. Date: May 10, 2012

(65) Prior Publication Data
US 2014/0118011 A1    May 1, 2014

(30) Foreign Application Priority Data

Nov. 5, 2010 (DE) .......................... 10 2010 043 519
Apr. 4, 2011 (DE) .......................... 10 2011 006 743

(51) Int. Cl.
*G01R 27/26* (2006.01)
*G06F 1/16* (2006.01)
(Continued)

(52) U.S. Cl.
CPC .......... *G01R 27/2605* (2013.01); *G06F 1/1684* (2013.01); *G06F 1/3231* (2013.01);
(Continued)

(58) Field of Classification Search
CPC . G01R 27/2605; G06F 1/1684; G06F 1/3231; H03K 17/955; H03K 17/962; H03K 2217/960705; H03K 2217/960775; Y02B 60/1289
USPC ........................................................ 324/676
See application file for complete search history.

(56) References Cited

U.S. PATENT DOCUMENTS

| 4,016,490 A | 4/1977 | Weckenmann et al. ........ 324/671 |
| 6,859,141 B1 | 2/2005 | Van Schyndel et al. ...... 340/562 |

(Continued)

FOREIGN PATENT DOCUMENTS

| DE | 202005015210 U1 |   | 3/2006 | ........... H03K 17/955 |
| DE | 202005015210 U1 | * | 4/2006 | ........... H03K 17/955 |

(Continued)

OTHER PUBLICATIONS

International Search Report and Written Opinion, Application No. PCT/EP2011/069567, 13 pages, Jan. 27, 2012.
(Continued)

*Primary Examiner* — Benjamin M Baldridge
*Assistant Examiner* — Rahul Maini
(74) *Attorney, Agent, or Firm* — Slayden Grubert Beard PLLC

(57) ABSTRACT

A method for the detection of a gripping of a hand-held device with one hand, using a capacitive sensor device, uses at least one transmitting electrode, at least one compensating electrode and at least one receiving electrode. An electrical signal is tapped at the receiving electrode and the sensor device can be operated in a first operating mode and in a second operating mode. In the first operating mode, a first alternating electrical signal is applied to the transmitting electrode and a second alternating electrical signal is applied to the compensating electrode. In the second operating mode, the second alternating signal is only applied to the compensating electrode. Furthermore, a sensor device can be provided which is configured to perform the method as described above.

29 Claims, 14 Drawing Sheets

(51) Int. Cl.
  *G06F 1/32* (2006.01)
  *H03K 17/955* (2006.01)
  *H03K 17/96* (2006.01)

(52) U.S. Cl.
  CPC ............ *H03K17/955* (2013.01); *H03K 17/962* (2013.01); *H03K 2217/960705* (2013.01); *H03K 2217/960775* (2013.01); *Y02B 60/1289* (2013.01)

(56) References Cited

U.S. PATENT DOCUMENTS

| | | | |
|---|---|---|---|
| 6,977,675 B2 | 12/2005 | Kotzin | 348/208.2 |
| 7,352,355 B2* | 4/2008 | Troxell et al. | 345/156 |
| 7,406,393 B2* | 7/2008 | Ely et al. | 702/150 |
| 2008/0202251 A1* | 8/2008 | Serban et al. | 73/780 |

FOREIGN PATENT DOCUMENTS

| | | | | |
|---|---|---|---|---|
| WO | 2010/115940 A1 | 10/2010 | | G06F 1/32 |
| WO | WO 2010115940 A1 * | 10/2010 | | H03K 17/96 |
| WO | 2012/059601 A1 | 5/2012 | | G06F 1/16 |

OTHER PUBLICATIONS

International Preliminary Report on Patentability, Application No. PCT/EP2011/069567, 10 pages, May 7, 2013.
Chinese Office Action, Application No. 201180046625.6, 6 pages.

* cited by examiner

METHOD AND SENSOR DEVICE FOR THE DETECTION OF A GRIPPING OF A HAND-HELD DEVICE

CROSS-REFERENCE TO RELATED APPLICATIONS

This application is a U.S. National Stage application of International Application No. PCT/EP2011/069567 filed Nov. 7, 2011, which designates the United States of America, and claims priority to DE Application No. 10 2010 043 519.8 filed Nov. 5, 2010 and DE Patent Application No. 10 2011 006 743.4 filed Apr. 4, 2011, the contents of which are hereby incorporated by reference in their entirety.

TECHNICAL FIELD

The present invention relates to a method for the detection of a gripping of a hand-held device with one hand, using a capacitive sensor device as well as a sensor device for the detection of a gripping of a hand-held device with one hand. Furthermore, the invention relates to a hand-held device comprising a sensor device according to the present invention, which is configured to perform the method according to the present invention.

BACKGROUND

Capacitive sensor devices, which can be, for example, arranged at a hand-held device in order to detect a gripping of the hand-held device with one hand are known from prior art. A change of the dielectric properties in the area of the sensor electrodes of the capacitive sensor device suggests a gripping of the hand-held device with one hand. When a gripping of the hand-held device with one hand is detected, the hand-held device can be, for example, switched from a sleep mode to an active mode.

With the capacitive sensor devices for the detection of a gripping of a hand-held device with one hand known from prior art, the problem is that, depending on the technology used, the gripping of the hand-held device with one hand cannot be reliably detected in case of good or poor ground reference.

Prior art has tried to solve this problem in such a way that a switching of the supply voltage of an electrical hand-held device is detected, wherein an alternative measuring mode is activated when a switching of the supply voltage is detected, which also enables the detection of a gripping of the hand-held device in case of good ground reference. For example, an electrical hand-held device is well grounded when the ground reference of the device is, for example, effected via a connected USB cable. In addition to the data transmission, the USB connector also provides a voltage of 5 V for the power supply of USB devices, which can be detected in order to take corresponding measures with respect to the measuring mode.

This way, it can be determined that the device providing the power supply for the hand-held device has a good ground reference. However, it cannot be determined how good the ground reference is actually. A further disadvantage is that the ground reference can also be modified in a different way. For example, touching a part of an electrical hand-held device being connected to ground, can lead to a stronger coupling to ground. Such a modification of the ground reference may not be detected by the detection of the change of the supply voltage, since the supply voltage does not change.

On the other hand, devices with a fairly poor ground reference, such as a USB battery, can provide an alternative supply voltage. However, the modified supply voltage can be detected, but the alternative measuring mode described before will probably not be activated, since the ground reference changes only slightly or does not change at all with modified supply voltage. However, if the alternative measuring mode would still be used for the detection of a gripping of the hand-held device, the capacitive sensor device would no longer be able to reliably detect the gripping of a hand-held device without additional measures.

Furthermore, this way it is not possible to determine the actual ground reference.

SUMMARY

Thus, according to various embodiments, solutions can be provided in order to securely and reliably detect a gripping of a hand-held device with one hand also in case of changing ground reference. Faulty activations or erroneous detections should be prevented reliably.

According to an embodiment, a method and a sensor device can be provided for the detection of a gripping of a hand-held device with one hand as well as a hand-held device.

According to one embodiment, in a method for the detection of a gripping of a hand-held device with one hand, using a sensor device, comprising at least one transmitting electrode, at least one compensating electrode and at least one receiving electrode, a first electrical signal is tapped at the receiving electrode, and the sensor device can be operated in a first operating mode and in a second operating mode, wherein—in the first operating mode, a first alternating electrical signal is applied to the transmitting electrode and a second alternating electrical signal is applied to the compensating electrode and the gripping of the hand-held device is detected once the amount of the first electrical signal exceeds a first threshold value, and—in the second operating mode, the second alternating electrical signal is applied to the compensating electrode and the gripping of the hand-held device is detected once the first electrical signal meets a predetermined detection criterion.

According to a further embodiment, a transmission measuring can be performed in the first operating mode, wherein an absorption measuring is performed in the second operating mode, wherein the transmitting electrode is operated as receiving electrode and the gripping of the hand-held device is detected once a second electrical signal tapped at the transmitting electrode meets a predetermined detection criterion. According to a further embodiment, the predetermined detection criterion may comprise falling below a second threshold value. According to a further embodiment, the first alternating electrical signal may have a different phasing with regard to the second alternating electrical signal and/or the amplitude of the first alternating electrical signal differs from the amplitude of the second alternating electrical signal in the first operating mode. According to a further embodiment, the compensating electrode can be configured in several parts and comprises at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode. According to a further embodiment, a third alternating electrical signal can be applied to the first compensating electrode and a fourth alternating electrical signal is applied to the second compensating electrode and wherein the different phasing and/or the different amplitudes with regard to the third alternating electrical signal and the fourth alternating electrical signal are set. According to a further embodiment, the first electrical signal and the second electrical signal can be tapped at the respective electrode in a multiplexing method and are supplied to an analysis device. According to a further embodiment, the third alternating electrical signal and the fourth alternating electrical signal can be applied to the respective compensating electrode in a multiplexing method. According to a further embodiment, the sensor device may change from the first operating mode to the second operating mode in case no gripping of the hand-held device has been detected in the first operating mode. According to a further embodiment, the sensor device may cyclically change from the first operating mode to the second operating mode. According to a further embodiment, the sensor device may further comprises at least one field measuring electrode, wherein the at least one field measuring electrode can be arranged relatively to the compensating electrode in such a way that an alternating electrical field emitted at the compensating electrode can couple into the field measuring electrode in the second operating mode.

According to another embodiment, a sensor device for the detection of a gripping of a hand-held device with one hand, may comprise at least one transmitting electrode, at least one compensating electrode, at least one receiving electrode, wherein the sensor device is configured to—apply a first alternating electrical signal to the transmitting electrode and to apply a second alternating electrical signal to the compensating electrode and to detect the gripping of the hand-held device once the amount of the first electrical signal exceeds a first threshold value in a first operating mode, and—apply the second alternating electrical signal to the compensating electrode and to detect the gripping of the hand-held device once the first electrical signal tapped at the receiving electrode meets a predetermined detection criterion in a second operating mode.

According to a further embodiment of the device, the sensor device can be configured to perform at least one transmission measuring in the first operating mode, to perform at least one absorption measuring in the second operating mode, wherein the transmitting electrode can be operated as receiving electrode, and to detect the gripping of the hand-held device once a second electrical signal tapped at the transmitting electrode meets a predetermined detection criterion. According to a further embodiment of the device, the predetermined detection criterion may comprise falling below a second threshold value. According to a further embodiment of the device, the sensor device may further comprise at least one signal generator, which can be coupled with the at least one transmitting electrode and with the at least one compensating electrode to apply the first alternating electrical signal to the transmitting electrode and the second alternating electrical signal to the compensating electrode, wherein the different phasing and/or the different amplitudes of the first alternating electrical signal and the second alternating electrical signal can be set. According to a further embodiment of the device, a phase shifter or an inverter can be arranged between the signal generator and the compensating electrode in order to change the phasing of the second alternating electrical signal with regard to the phasing of the first alternating electrical signal in the first operating mode. According to a further embodiment of the device, the compensating electrode can be configured in several parts and comprises at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode. According to a further embodiment of the device, a third alternating electrical signal can be applied to the first compensating electrode and a fourth alternating electrical signal can be applied to the second compensating electrode, and wherein the different phasing and/or the different amplitudes with regard to the third alternating electrical signal and the fourth alternating electrical signal can be set. According to a further embodiment of the device, the sensor device can be configured to change from the first operating mode to the second operating mode in case no gripping of the hand-held device has been detected in the first operating mode. According to a further embodiment of the device, the sensor device can be configured to cyclically change from the first operating mode to the second operating mode. According to a further embodiment of the device, the predetermined detection criterion may comprise at least one of the following—the amount of the first electrical signal and the second electrical signal fall below a second threshold value, respectively, and—the amount of the sum signal resulting from the first electrical signal and—the second electrical signal falls below a second threshold value. According to a further embodiment of the device, the second threshold value can be set—as a function of the first threshold value, and/or—as a function of a preset second threshold value.

According to yet another embodiment, a hand-held device, particularly an electrical hand-held device, may comprise a sensor device for the detection of a gripping of the hand-held device as described above. According to yet another embodiment of the hand-held device, the sensor device can be configured to perform any of the above described methods.

According to yet another embodiment of the hand-held device, the transmitting electrode and the receiving electrode are arranged at the hand-held device at a distance from one another, and wherein die compensating electrode is arranged at the hand-held device in such a way that it can be brought into a capacitive coupling with the receiving electrode in the first operating mode and into a capacitive coupling with the transmitting electrode and the receiving electrode in the second operating mode. According to a further embodiment of the hand-held device, the transmitting electrode can be substantially arranged at a first side wall of the hand-held device and the receiving electrode is substantially arranged at a second side wall, preferably on the opposite side from the first side wall. According to a further embodiment of the hand-held device, the compensating electrode can be configured in several parts and comprises at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode.

According to yet another embodiment, a program code can perform any of the above described methods, when being loaded in a data processing device, particularly a microprocessor of a hand-held device.

According to yet another embodiment, a data storage device may be loaded with program code as described above.

BRIEF DESCRIPTION OF THE DRAWINGS

Further details and features as well as exemplary embodiments can be found in the following description in combination with the drawings. The drawings show.

DETAILED DESCRIPTION

Figure 1:
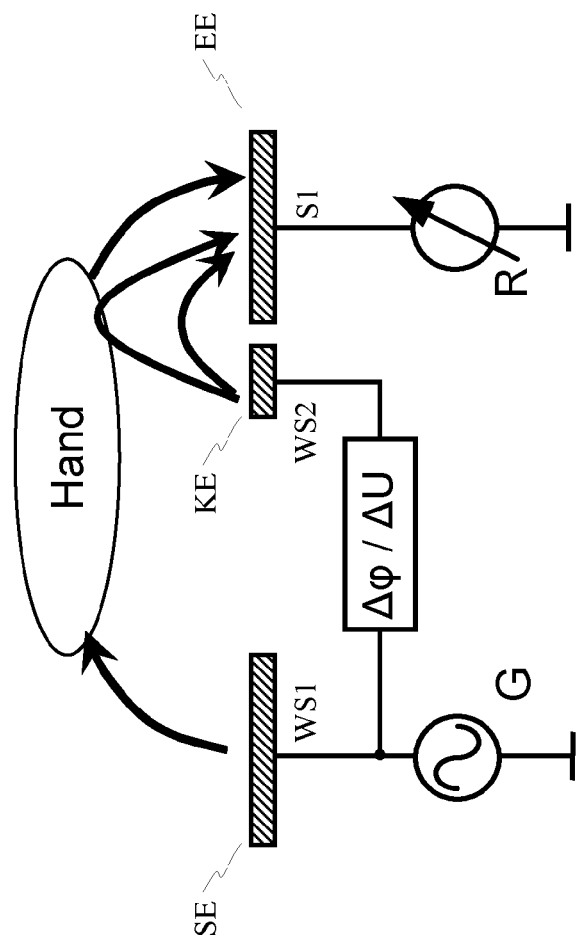
FIG. 1 a sensor device according to an embodiment, which is configured to be operated in a first operating mode and in a second operating mode according to the method according to various embodiments.

Thus, various embodiments provide a method for the detection of a gripping of a hand-held device with one hand, using a sensor device comprising at least one transmitting electrode, at least one compensating electrode and at least one receiving electrode, wherein a first electrical signal is tapped at the receiving electrode, and the sensor device may be operated in a first operating mode and in a second operating mode, wherein in the first operating mode, a first alternating electrical signal is applied to the transmitting electrode and a second alternating electrical signal is applied to the compensating electrode and the gripping of the hand-held device is detected once the amount of the first electrical signal exceeds a first threshold value, and in the second operating mode, the second alternating electrical signal is applied to the compensating electrode and the gripping of the hand-held device is detected once the first electrical signal meets a predetermined detection criterion.

Various embodiments further provide a method for the detection of a gripping of a hand-held device with one hand, using a capacitive sensor device, comprising at least one transmitting electrode, at least one compensating electrode and at least one receiving electrode, wherein an electrical signal is tapped at the receiving electrode, and the sensor device can be operated in a first operating mode and in a second operating mode, wherein in the first operating mode, a first alternating electrical signal is applied to the transmitting electrode and a second alternating electrical signal is applied to the compensating electrode and the gripping of the hand-held device is detected once the amount of the electrical signal exceeds a first threshold value, and in the second operating mode, the second alternating electrical signal is applied to the compensating electrode and the gripping of the hand-held device is detected once the amount of the electrical signal falls below a second threshold value.

Since the sensor device is operated in a first and in a second operating mode, wherein a gripping can also be detected in case of a good ground reference of the sensor device in the second operating mode, it is ensured that a gripping can also be detected in case of changing ground reference of the sensor device.

In the first operating mode, a different phasing of the first alternating electrical signal may be selected with regard to the phasing of the second alternating electrical signal and/or different amplitude of the first alternating electrical signal can be selected with regard to the amplitude of the second alternating electrical signal. The different phasing and/or the different amplitudes may also be zero.

It has proven beneficial to change the sensor device from the first operating mode to the second operating mode in case no gripping of the hand-held device has been detected in the first operating mode.

It can also be changed to the second operating mode in case a gripping has already been detected in the first operating mode. Thus, the second operating mode may comprise a sort of "confirmation" of the detection in the first operating mode. Thus, the stability is increased and misinterpretations may be reduced.

The sensor device can cyclically change from the first operating mode to the second operating mode.

The sensor device may further comprise at least one field measuring electrode, wherein the at least one field measuring electrode can be arranged relatively to the compensating electrode in such a way that an alternating electrical field emitted at the compensating electrode can couple into the field measuring electrode in the second operating mode.

Various embodiments further provide a sensor device for the detection of a gripping of a hand-held device with one hand, comprising at least one transmitting electrode, at least one compensating electrode and at least one receiving electrode, wherein the sensor device is configured to
- apply a first alternating electrical signal to the transmitting electrode and to apply a second alternating electrical signal to the compensating electrode and to detect the gripping of the hand-held device once the amount of the first electrical signal exceeds a first threshold value in a first operating mode, and
- only apply the second alternating electrical signal to the compensating electrode and to detect the gripping of the hand-held device once the amount of the electrical signal tapped at the receiving electrode falls below a second threshold value in a second operating mode.

The amount of the first threshold value can be larger than the amount of the second threshold value.

The arrangement of the compensating electrode and the receiving electrode relative to one another, such as at a hand-held device, can be selected in such a way that the electrical signal comprises a predetermined signal level in the second operating mode, wherein the amount of the signal level is larger than the second threshold value.

The sensor device may comprise a signal generator, which can be coupled with the at least one transmitting electrode and the at least one compensating electrode in order to apply the first alternating electrical signal to the transmitting electrode and to apply the second alternating electrical signal to the compensating electrode, wherein a phase shifter or an inverter is arranged between the signal generator and the compensating electrode in order to change the phasing of the second alternating electrical signal with regard to the phasing of the first alternating electrical signal in the first operating mode.

The phase shifter and/or the inverter can also be arranged between the signal generator and the transmitting electrode.

As an alternative or as an addition, an attenuator can be arranged between the signal generator and the transmitting electrode and/or the compensating electrode in order to change the amplitude of the first alternating electrical signal or of the second alternating electrical signal which is to be applied to the transmitting electrode or to the compensating electrode.

The sensor device can be configured to change from the first operating mode to 30 the second operating mode in case no gripping of the hand-held device has been detected.

The sensor device can be configured to cyclically change from the first operating mode to the second operating mode.

According to an embodiment, the compensating electrode can be configured in several parts and may comprise at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode.

A third alternating electrical signal can be applied to the first compensating electrode and a fourth alternating electrical signal can be applied to the second compensating electrode, wherein the different phasing and/or the different amplitudes of the third alternating electrical signal with regard to the fourth alternating electrical signal can be set.

The predetermined detection criterion may comprise at least one of the following
- the amount of the first electrical signal and the second electrical signal fall below a second threshold value, respectively, and
- the amount of the sum signal resulting from the first electrical signal and the second electrical signal falls below a second threshold value.

The second threshold value can be set
- as a function of the first threshold value, and/or
- as a function of a preset second threshold value.

Various embodiments further provide a hand-held device, particularly an electrical hand-held device with a sensor device. The sensor device can be configured to perform a method according to various embodiments.

The transmitting electrode and the receiving electrode can be arranged at the hand-held device at a distance from one another, wherein die compensating electrode is arranged at the hand-held device in such a way that it can be brought into a capacitive coupling with the receiving electrode in the first operating mode and into a capacitive coupling with the transmitting electrode and the receiving electrode in the second operating mode.

The transmitting electrode can be substantially arranged at a first side wall of the hand-held device and the receiving electrode can be substantially arranged at a second side wall, preferably on the opposite side from the first side wall.

Various embodiments further provide a sensor device for the detection of a gripping of a hand-held device with one hand, comprising at least one transmitting electrode, at least one compensating electrode and at least one receiving electrode, wherein the sensor device is configured to
- perform at least one transmission measuring in a first operating mode, wherein a first alternating electrical signal can be applied to the transmitting electrode and a second alternating electrical signal can be applied to the compensating electrode and to detect the gripping of the hand-held device once the amount of the first electrical signal exceeds a first threshold value, and
- perform at least one absorption measuring in a second operating mode, wherein the transmitting electrode can be operated as receiving electrode and wherein the second alternating electrical signal can be applied to the compensating electrode and to detect the gripping of the hand-held device once the amount of the first electrical signal tapped at the receiving electrode and of a second electrical signal tapped at the transmitting electrode meet a predetermined detection criterion.

This way, it is advantageously possible to detect a gripping of a hand-held device with one hand regardless of the ground reference of the hand-held device. In the first operating mode, the gripping of the hand-held device is detected in case of a poor ground reference of the hand-held device, whereas in the second operating mode, the gripping of the hand-held device is detected in case of a good ground reference of the hand-held device.

Furthermore, various embodiments provide a program code, which executes the method according to various embodiments when being loaded in a data processing device, as well as a data storage device with the program code according to various embodiments.

The data processing device can, for example, be a microcontroller of an electrical hand-held device. The electrical hand-held device may be a smartphone, a mobile radio unit, a computer mouse, a remote control for a device, a digital camera, a game controller, a personal digital assistant, a tablet PC or the like.

FIG. 1 shows a sensor device according to various embodiments for the detection of a gripping of a hand-held device with one hand, which can be operated in a first operating mode (transmission mode) and in a second operating mode (absorption mode) as described in detail in the following.

Various embodiments provide at least three electrodes for the detection of a gripping of a hand-held device with one hand. The sensor device comprises at least one transmitting electrode SE, at least one compensating electrode KE and at least one receiving electrode EE. The receiving electrode EE is connected to a signal input of an analysis device or of a control device (receiver R). The transmitting electrode SE and the compensating electrode KE are each coupled with a signal generator G, which provides an alternating electrical quantity of a certain frequency and certain amplitude. This alternating electrical quantity is hereinafter referred to as alternating signal or as alternating electrical signal WS1, WS2. A first alternating electrical signal WS1 is applied to the transmitting electrode SE and a second alternating electrical signal WS2 is applied to the compensating electrode KE.

The electrodes SE, EE and KE can be, for example, arranged at a housing of the electrical hand-held device. Preferably, the electrodes are arranged at the inner side of the housing wall of an electrical hand-held device. Preferably, the compensating electrode KE is arranged between the transmitting electrode SE and the receiving electrode EE, as can be clearly seen in FIG. 1. The transmitting electrode can be arranged at a left housing wall and the compensating electrode and the receiving electrode can be arranged at the right housing wall.

When arranging the electrodes SE, KE and EE at an electrical hand-held device, care must be taken that the electrodes can at least be partially covered by the hand when the hand-held device is gripped with one hand in order to ensure a coupling of an alternating electrical field being emitted at the transmitting electrode SE or at the compensating electrode KE via the hand into the receiving electrode EE.

According to an embodiment, the compensating electrode is to be arranged relatively to the transmitting electrode and to the receiving electrode in such a way that the compensating electrode can be, particularly in the second operating mode, brought into a capacitive coupling with the receiving electrode and the transmitting electrode. This is required in case the transmitting electrode, which is operated as receiving electrode in the second operating mode, is arranged at a left housing wall of the electrical hand-held device and the receiving electrode is arranged at a right housing wall of an electrical hand-held device in order to detect an absorption of the respective alternating electrical field generated at the right housing wall as well as at the left housing wall, respectively, when gripping the hand-held device. This way, it is reliably prevented that an approximation to the hand-held device from the side or a touch of the hand-held device only at one side is detected as gripping of the hand-held device.

The compensating electrode can also be configured in several parts in such a way that there is at least one first compensating electrode KE1 and one second compensating electrode KE2 between the transmitting electrode and the receiving electrode. The first compensating electrode is arranged in the area of the transmitting electrode SE, the second compensating electrode is arranged in the area of the receiving electrode EE. Possible variants for an operation of a capacitive sensor device according to various embodiments comprising a transmitting electrode SE, a receiving electrode EE and two compensating electrodes KE1, KE2 are described in detail in the following.

A first alternating electrical signal WS1 of the signal generator G is applied to the transmitting electrode SE. The first alternating electrical signal WS1 can have a frequency of about 10 kHz to 300 kHz and can comprise an amplitude, which preferably should not exceed the value of 20 V. However, the frequency may also be selected higher or lower.

A second alternating electrical signal WS2 is applied to the compensating electrode KE, preferably comprising the wave form and the frequency of the first alternating electrical signal WS1. The second alternating electrical signal WS2 can have a different phasing with regard to the first alternating electrical signal WS1. The phase difference can be accomplished by means of a phase shifter $\Delta\phi$, being arranged between the signal generator and the compensating electrode KE. As an alternative, the phase shifter $\Delta\phi$ can also be arranged between the signal generator G and the transmitting electrode SE.

Furthermore, also an inverter can be provided as an alternative to the phase shifter $\Delta\phi$, inverting the alternating electrical signal WS1 or WS2 provided at the signal generator G. In this case, the alternating electrical signal WS2 applied to the compensating electrode KE is phase-shifted by 180° with regard to first alternating electrical signal WS1 applied to the transmitting electrode SE.

However, the alternating electrical signal WS2 applied to the compensating electrode KE can have an amplitude, which is different from the amplitude of the alternating electrical signal WS1 applied to the transmitting electrode SE.

It has proven to be advantageous when
- the alternating electrical signal WS1 has the same amplitude as the alternating electrical signal WS2 and the phase shift between the two alternating electrical signals WS1 and WS2 is different from 0° and different from 180°, or
- the phase shift between the two alternating electrical signals WS1 and WS2 is 180° (or 0°) and the amplitudes of the two alternating electrical signals WS1 and WS2 are different. Preferably, the amplitude of the second alternating electrical signal WS2 is smaller than the amplitude of the first alternating electrical signal WS1.

Furthermore, it has proven to be advantageous when
- the phase shift between the two alternating electrical signals WS1 and WS2 is 180° (or 0°) and the amplitudes of the two alternating electrical signals WS1 and WS2 are different for measurings in the transmission mode. Preferably, the amplitude of the second alternating electrical signal WS2 is smaller than the amplitude of the first alternating electrical signal WS1.
- the alternating electrical signal WS2 has a substantially larger amplitude than WS1 for measurings in the absorption mode. Ideally, WS1 is 0 V.
- adjustments during the operating time can be made by changing the amplitude of WS2 or by changing the phasing between WS1 and WS2.

The transmitting electrode SE or the alternating electrical signal WS1 applied to it is configured in such a way that the alternating electrical field emitted at the transmitting electrode SE can couple into the receiving electrode EE, preferably when a hand approximates to the electrodes of the sensor device.

The compensating electrode KE or the alternating electrical signal WS2 applied to it is configured in such a way that the alternating electrical field emitted at the compensating electrode KE can also couple into the receiving electrode EE. Preferably, the alternating electrical field emitted at the compensating electrode KE also couples into the receiving electrode EE in case no hand approximates to the sensor device or in case an electrical hand-held device comprising the sensor device is not gripped with the hand. This way, a certain basic coupling is ensured between the compensating electrode KE and the receiving electrode EE.

The level of the alternating electrical field acting on the receiving electrode EE is reduced or (almost) eliminated in case of an inversely phased interference by the alternating electrical field emitted at the compensating electrode KE, which can have a different phasing with regard to the alternating electrical field emitted at the transmitting electrode SE and/or can have a different amplitude. The approximation of a hand towards the electrodes or a gripping with one hand changes the alternating electrical field acting on the receiving electrode EE in such a way that an alternating electrical signal can be tapped at the receiving electrode EE, which is representative of the approximation of a hand towards the electrodes or of a gripping of a hand-held device with one hand.

The alternating electrical field emitted at the transmitting electrode SE is at least partially drawn from the effective area of the alternating electrical field emitted at the compensating electrode due to the approximating hand or due to a hand gripping the electrical hand-held device, and then directly couples into the receiving electrode via the hand, which results in a significant increase of the level of the electrical signal S1 tapped at the receiving electrode EE.

In case of no grounding or poor grounding, the alternating electrical field emitted at the transmitting electrode SE directly couples into the receiving electrode via the hand due to the approximating hand or due to a hand gripping the electrical hand-held device, and is then added to the signal of the compensating electrode, which results in a significant increase of the level of the electrical signal S1 tapped at the receiving electrode EE (transmission of the alternating electrical signal).

The entire system is preferably configured in such a way that the electrical signal S1 tapped at the receiving electrode EE does not exceed a predetermined signal level in case no hand is close to the electrodes. This can be achieved by arranging the electrodes SE, EE and KE relatively to one another at the housing or by adjusting the level and/or the phasing of WS2.

The exact arrangement of the individual electrodes at a housing of an electrical hand-held device or the respective dimensions as well as the exact characteristics (frequencies, amplitudes or phasings) of the alternating electrical signals WS1 or WS2 substantially depend on the precise shape of the device and its size. The arrangement of the electrodes, the dimensions of the electrodes and the characteristics of the alternating signals WS1 and WS2 can be determined empirically for a precise device and can be adapted to one another in such a way that the requirements described before with regard to an electrical signal tapped at the receiving electrode EE enable a reliable detection of a gripping of the hand-held device with one hand.

Two operating modes are provided for the operation of the capacitive sensor device in order to ensure a reliable detection of a gripping of a hand-held device with one hand in case of different ground references. The two operating modes are described in detail in the following.

Figure 2:
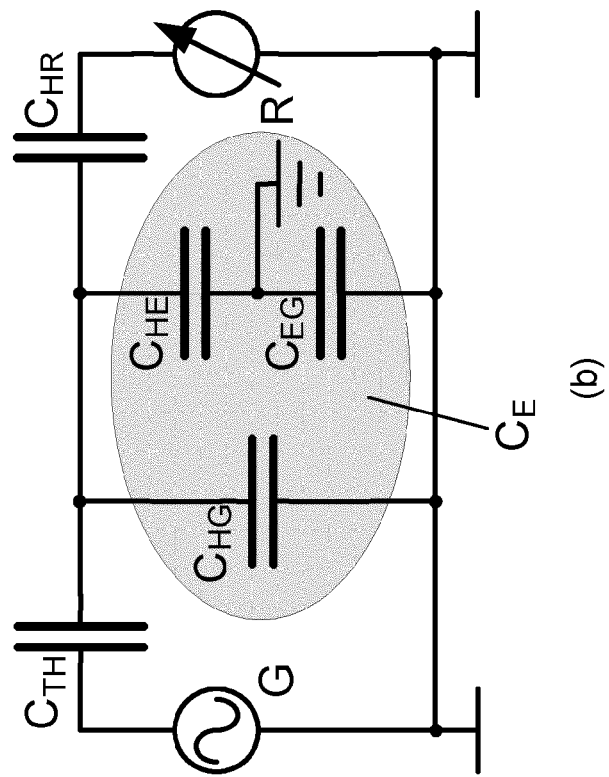
FIG. 2 a coupling (transmission) between a transmitting electrode and a receiving electrode of the sensor device according to various embodiments as well as a corresponding capacitive equivalent circuit diagram.
Figure 2:
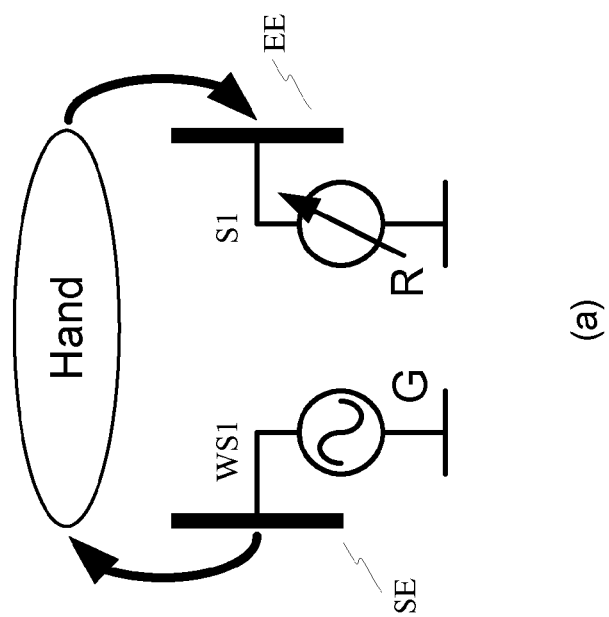

FIG. 2 shows the capacitive coupling paths between a hand and a device ground with regard to the transmitting electrode SE and the receiving electrode EE of the sensor device according to various embodiments. A first alternating electrical signal WS1 of a signal generator G is applied to the transmitting electrode SE. This way, an alternating electrical field is emitted at the transmitting electrode SE. The transmission between the transmitting electrode SE and the receiving electrode EE is generated by a capacitive coupling between the transmitting electrode SE and the receiving electrode EE being generated by the hand.

FIG. 2a and FIG. 2b show the capacitive coupling paths between a hand and a device ground with regard to the transmitting electrode SE and the receiving electrode EE in the transmission mode (FIG. 2a) and with regard to the compensating electrode KE and the receiving electrode EE in the absorption mode (FIG. 2b).

In the transmission mode, a first alternating electrical signal WS1 and a second alternating electrical signal WS2 of a signal generator G are applied to the transmitting electrode and to the compensating electrode, respectively. This way, an alternating electrical field is emitted at the transmitting electrode SE or at the compensating electrode KE, respectively.

In the transmission mode (FIG. 2a), the alternating electrical field emitted at the transmitting electrode SE couples into the receiving electrode EE via the hand, which leads to an increase in level of the electrical signal S1 tapped at the receiving electrode.

In the absorption mode (FIG. 2b), the alternating electrical field emitted at the compensating electrode KE couples directly into the receiving electrode EE due to the physical proximity of the compensating electrode KE to the receiving electrode EE. An approximating hand results in that a part of the arising field lines between the compensating electrode KE and the receiving electrode EE are conducted into the ground via the body, which substantially leads to a level reduction of the electrical signal S1 tapped at the receiving electrode.

FIG. 2a shows the coupling path between the transmitting electrode SE and the receiving electrode EE via the hand. FIG. 2b shows a corresponding capacitive equivalent circuit diagram. The relevant capacities are the capacity $C_{TH}$ between the transmitting electrode SE and the hand as well as the capacity $C_{HR}$ between the hand and the receiving electrode EE. Furthermore, there is a capacitive coupling $C_E$ via the human body with regard to the device ground of the hand-held device. The coupling path $C_E$ can be generated directly by means of a capacitive coupling $C_{HG}$ between the palm of hand and the ground surface of the electrical hand-held device. As an alternative or in addition to that, the coupling path $C_E$ can be generated indirectly by means of the coupling $C_{HE}$ of the person with regard to the environment and the environment with regard to the device ground $C_{EG}$.

When the ground coupling $C_E$ is low on both paths $C_{HG}$ or $C_{HE}$, $C_{EG}$, there is substantially only the coupling via the hand. The change of the alternating electrical signal tapped at the receiving electrode EE when approximating to or gripping the hand-held device with the hand is maximum in this case and can therefore be detected particularly well and reliably. However, when the ground coupling $C_E$ is high on both paths $C_{HG}$ or $C_{HE}$, $C_{EG}$, the transmission via the hand is mainly shorted to ground. The change of the signal level of the electrical signal tapped at the receiving electrode EE can be very small in case of an approximation of the hand to the sensor device or in case of a gripping of the hand-held device with one hand. In the worst case, i.e. in case of a virtually unresistant coupling of the body or the hand to ground, there is almost no capacitive coupling between the transmitting electrode and the receiving electrode via the hand, so that the alternating electrical signal tapped at the receiving electrode EE virtually shows no signal level change in case of an approximation to the sensor device or in case of a gripping of a hand-held device with one hand. This would mean that a gripping of a hand-held device with one hand is substantially not detectable, since no transmission is generated between the transmitting electrode SE and the receiving electrode EE via the hand because of the almost unresistant coupling, but the transmission via the hand is mainly shorted to ground.

Figure 3:
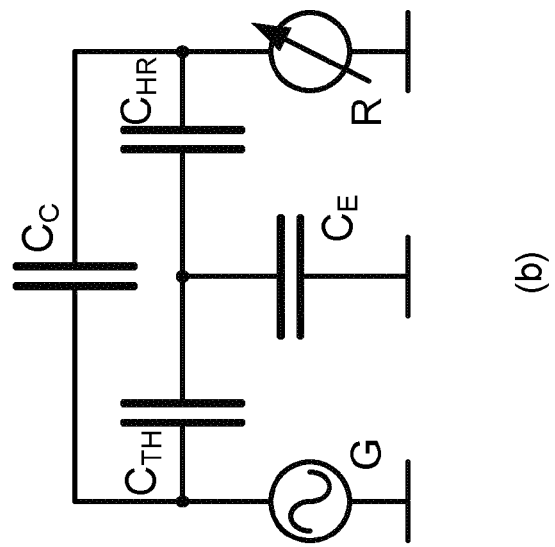
FIG. 3 the capacitive coupling paths between a compensating electrode and a receiving electrode of a sensor device according to various embodiments as well as a corresponding capacitive equivalent circuit diagram.
Figure 3:
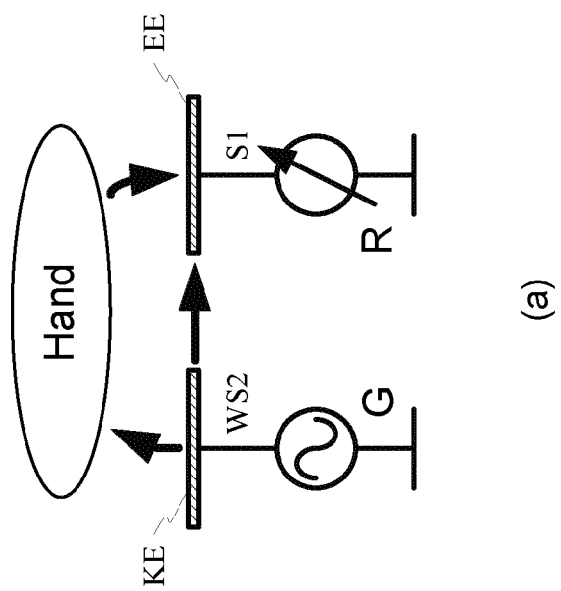

In order to still ensure a secure detection of a gripping of a hand-held device with one hand in case of unfavorable grounding conditions, an additional measuring is performed between the compensating electrode KE and the receiving electrode EE, as shown with reference to FIG. 3. Contrary to the arrangement of the transmitting electrode SE relative to the receiving electrode EE, the compensating electrode KE is arranged relatively to the receiving electrode EE in such a way that there is a certain basic coupling between the electrodes KE and EE in either case. The capacities at the compensating electrode KE and at the receiving electrode EE of the sensor device according to various embodiments as well as the coupling of the two electrodes via the hand are shown in FIG. 3. The compensating electrode KE is connected to a generator G as already mentioned with reference to FIG. 1. The receiving electrode EE is connected to a receiver R. The capacity $C_C$ describes the coupling between the compensating electrode KE and the receiving electrode EE. The additional coupling paths $C_{TH}$, $C_{HR}$ and $C_E$ have already been mentioned with reference to FIG. 2. The coupling $C_E$ against device ground shown in FIG. 3 substitutes the capacitive network CE illustrated in FIG. 2.

Figure 4:
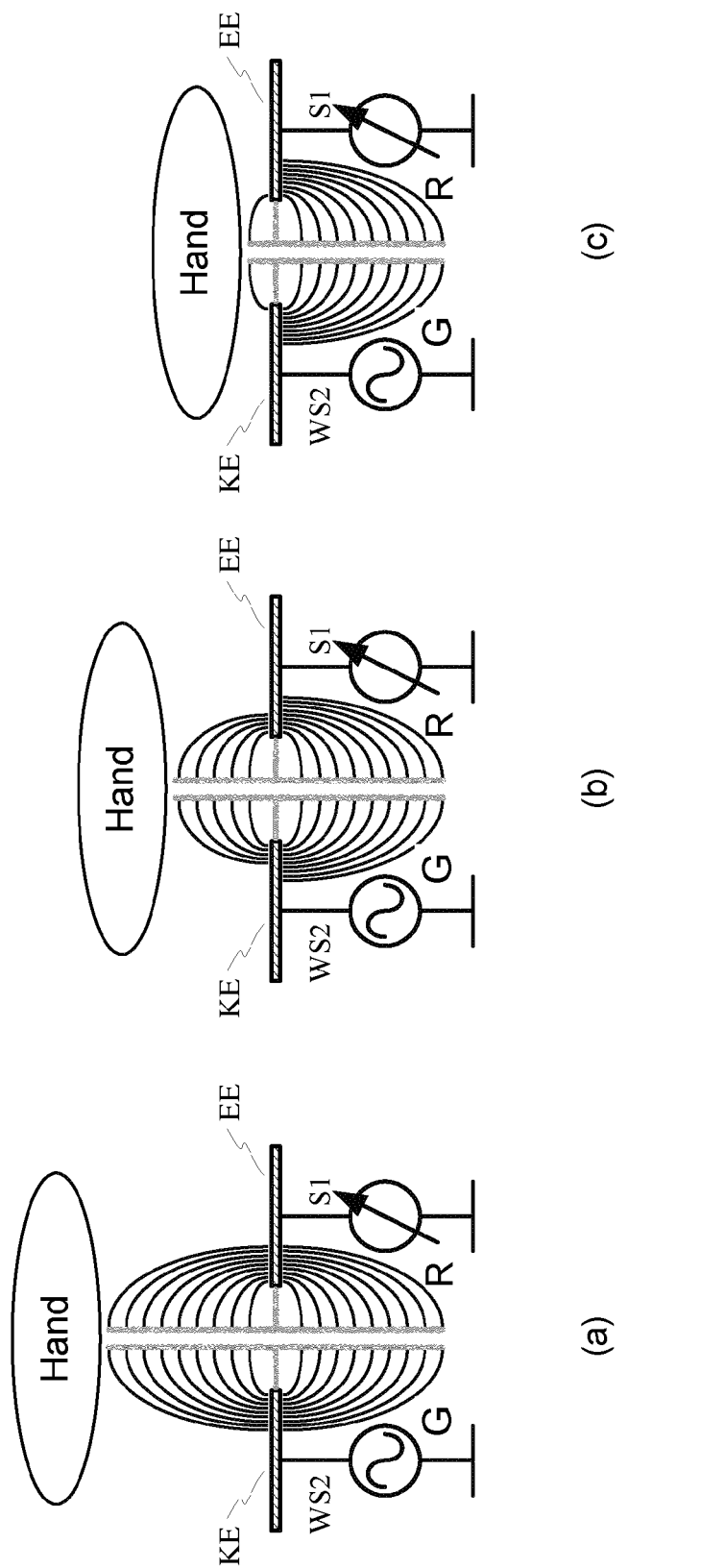
FIG. 4 the reduction of the capacitive stray field between a compensating electrode and a receiving electrode of a sensor device according to various embodiments as a function of the distance of a hand to the capacitive sensor device.

The compensating electrode KE and the receiving electrode EE are substantially flat electrode segments, being arranged adjacently to one another. The compensating electrode KE and the receiving electrode EE may be of low height, so that a capacitive coupling between the compensating electrode and the receiving electrode is almost completely generated by the stray field of the plate capacitor formed this way, as shown with reference to FIG. 4. The more space there is for the propagation of the field lines, the stronger the stray field between the compensating electrode KE and the receiving electrode EE. When the space for the stray field is limited, such as when a hand moves into the stray field, the effective capacity of the capacitor, i.e. the coupling capacity or the basic coupling between the electrodes KE and EE, is reduced and other coupling paths are formed. The latter are first and foremost the coupling paths between the electrodes KE, EE and the hand. The capacitive coupling between the compensating electrode KE and the receiving electrode EE via the hand may lead to an increase in level or to a level drop of the electrical signal tapped at the receiving electrode EE, depending on the ground coupling.

An alternating electrical signal WS2 is only applied to the compensating electrode KE in order to perform the measuring between the two electrodes KE and EE. No alternating electrical signal WS1 is applied to the transmitting electrode SE, so that no alternating electrical field is emitted at the transmitting electrode SE, which could affect the measuring between the compensating electrode KE and the receiving electrode EE.

Figure 5:
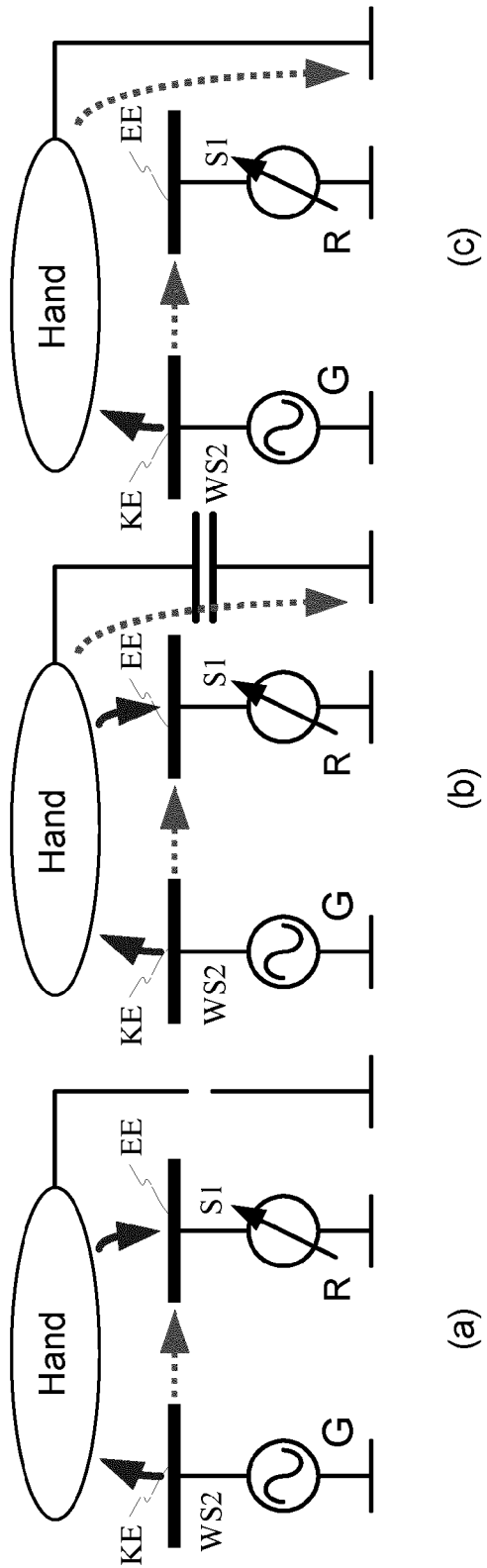
FIG. 5 the capacitive coupling paths at a compensating electrode and a receiving electrode of a sensor device according to various embodiments as a function of the ground reference.

The influence of different ground references on the coupling between the compensating electrode KE and the receiving electrode EE is shown with reference to FIG. 5. Different ground references considerably affect the distribution of the transmission effects, being generated by the coupling of the compensating electrode with the receiving electrode via the hand, and the reduction effects, being generated by the reference to ground of the hand. FIG. 5 shows three examples with different ground reference of the hand.

In case of a substantially non-existing ground reference of the hand (example (a)), the effective capacity of the capacitor is reduced by the limitation of the stray field. At the same time, however, the transmission effect between the compensating electrode KE and the receiving electrode EE via the hand is amplified, so that the reduction effect by the hand is substantially compensated by the transmission effect via the hand. It is even possible that the transmission via the hand is stronger than the reduction by the hand.

The "suction" via the capacitor to the ground of the device increases and increasingly reduces the influence of the transmission between the compensating electrode KE and the receiving electrode EE via the hand as the ground coupling increases (example (b)).

In case of a very good ground coupling (example (c)), the coupling path from the hand to the receiving electrode EE is almost completely shorted by the contact to ground so that there is only the reduction effect via the coupling capacity $C_C$ between the compensating electrode KE and the receiving electrode EE.

In case of a poor ground reference (example (a)), the change of the level of the electrical signal tapped at the receiving electrode EE is very small in case of an approximation of the hand to the electrodes or in case of a gripping of the hand-held device with one hand. The change of the level can possibly be even ambiguous with regard to the sign since the transmission via the hand can be stronger than the reduction by the hand. This option can be ruled out by an adequate electrode design. The change of the level of the electrical signal tapped at the receiving electrode EE increases with increasing grounding is maximum in case of an almost perfect ground coupling.

According to various embodiments, the change of the level of the electrical signal tapped at the receiving electrode EE without ground coupling is maximum when the alternating electrical field emitted at the transmitting electrode SE couples into the receiving electrode EE via the hand (compare FIG. 2). Furthermore, the change of the level of the electrical signal tapped at the receiving electrode EE is maximum when being grounded in case the alternating electrical field emitted at the compensating electrode KE is almost completely "sucked" via the hand via the capacitor to the device ground, wherein no signal is applied to the transmitting electrode and thus no alternating electrical field is emitted at the transmitting electrode SE.

Figure 6:
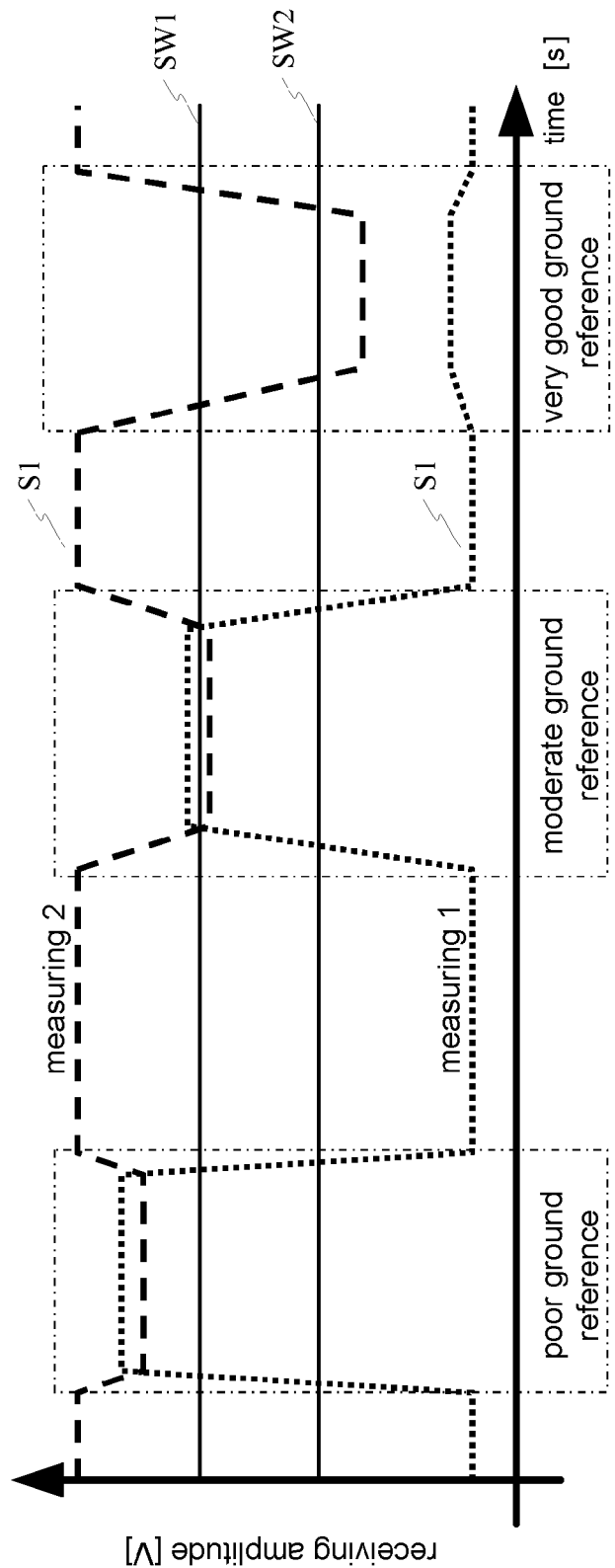
FIG. 6 the time dependent course of a measuring signal during a first operating mode and a second operating mode of the sensor device according to various embodiments in order to clarify the dependent relationship of the signal courses with different ground references.

FIG. 6 shows the course of the signal of an electrical signal tapped at the receiving electrode EE during a first measuring, wherein an alternating electrical signal WS1 or WS2 is applied to the transmitting electrode SE as well as to the compensating electrode KE, respectively, and a time dependent course of an electrical signal of a second measuring tapped at the receiving electrode EE, wherein only an alternating electrical signal WS2 is applied to the compensating electrode.

During the first measuring, the capacitive sensor device is operated in a first operating mode, wherein an alternating electrical signal is not only applied to the transmitting electrode but also to the compensating electrode, as described with reference to FIG. 1 and FIG. 2. A first threshold value SW1 is defined in order to detect a gripping of a hand-held device with one hand in the first operating mode. When the signal level of the electrical signal tapped at the receiving electrode exceeds this first threshold value SW1, a gripping of the hand-held device is detected.

In case of a poor reference to ground, a gripping of the hand-held device with one hand leads to an increase in level of the electrical signal tapped at the receiving electrode, wherein the signal level exceeds the first threshold value SW1. Due to the poor reference to ground, the alternating electrical field emitted at the transmitting electrode SE almost completely couples into the receiving electrode EE via the hand, which leads to an increase in level of the receiving signal at the receiving electrode.

In case of a moderate reference to ground the signal level of the receiving signal may exceed or not exceed the first threshold value SW1 in the first operating mode.

In case of a particularly good reference to ground, the change of level or the increase in level of the receiving signal at the receiving electrode EE is particularly small in the first operating mode; the signal level particularly does not exceed the first threshold value SW1 when gripping the hand-held device with one hand. In order to be still able to reliably detect the gripping of the hand-held device, the capacitive sensor device is also operated in a second operating mode, wherein the reduction effects between the compensating electrode KE and the receiving electrode EE are measured by the hand.

A second threshold value SW2 is defined for the second operating mode, wherein the receiving signal at the receiving electrode must fall below this threshold value in order to detect a gripping of the electrical hand-held device with the hand.

In case of a poor reference to ground, a gripping of the hand-held device only leads to a slight change of the signal level of the receiving signal and particularly does not fall below the second threshold value SW2.

In case of a moderate reference to ground, the signal level of the receiving signal at the receiving electrode either falls below or does not fall below the second threshold value SW2 in the second operating mode.

In case of a good reference to ground, the change of level of the receiving signal in case of a gripping of the hand-held device with one hand is almost maximum, the signal level of the receiving signal particularly falls below the second threshold value SW2. When the value falls below the second threshold value SW2 in the second operating mode, a gripping of the hand-held device with one hand is detected.

In case of a moderate reference to ground, it is possible that the first threshold value SW1 is neither exceeded in the first operating mode nor does the value fall below the second threshold value SW2 in the second operating mode. It is also possible that not only the first threshold value SW1 is exceeded in the first operating mode, but also the value falls below the second threshold value SW2 in the second operating mode. It is also possible that only one of the two threshold values is exceeded or the value falls below one of the two threshold values. An unambiguous and reliable detection of a gripping of a hand-held device is also possible in case of a moderate reference to ground by selecting an adequate electrode design and/or by selecting suitable detection thresholds. Selecting the corresponding detection thresholds or selecting the corresponding electrode design substantially depends on the geometry and the shape of the electrical hand-held device comprising the capacitive sensor according to various embodiments.

Figure 7:
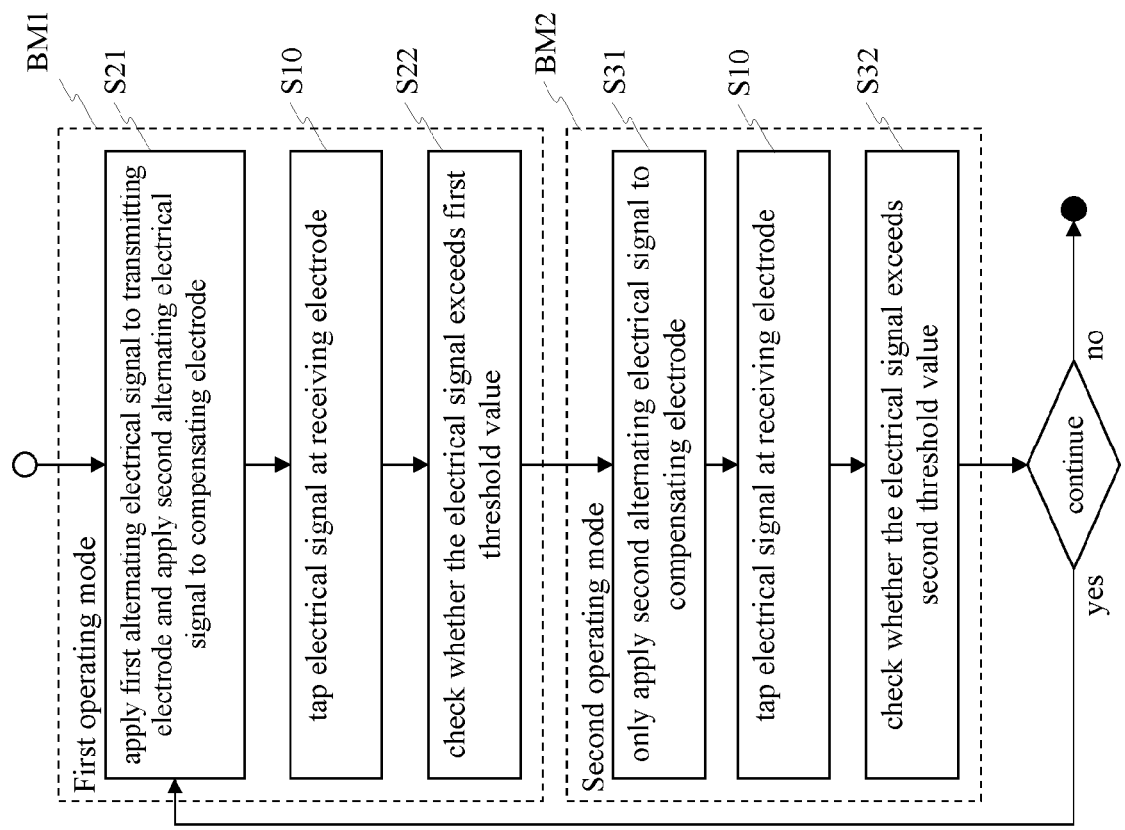
FIG. 7 a flow diagram of the method according to various embodiments for the detection of a gripping of a hand-held device with one hand, using a capacitive sensor device according to various embodiments.

FIG. 7 shows a flow diagram of the method according to various embodiments for the detection of a gripping of a hand-held device with one hand. An electrical signal S10 is tapped at the receiving electrode EE during the entire measuring. A measuring cycle is substantially divided into two sections, namely a measuring in a first operating mode and a measuring in a second operating mode.

First of all, a measuring is performed in a first operating mode BM1, wherein an electrical signal tapped at the receiving electrode is analyzed. In the first operating mode BM1, a first alternating electrical signal is applied to the transmitting electrode and a second alternating electrical signal is applied to the compensating electrode, as described with reference to FIG. 1. Step S22 checks whether the signal level of the electrical signal tapped at the receiving electrode exceeds a first threshold value SW1. When the signal level exceeds the first threshold value SW1, a detection information signal can be generated, signalizing a gripping of the electrical hand-held device with one hand. The detection information signal can, for example, be made available to a microcontroller of the electrical hand-held device for further processing.

After the check according to step S22, the device changes from the first operating mode BM1 to the second operating mode BM2. In a first step S31 of the second operating mode BM2, a second alternating electrical signal WS2 is applied only to the compensating electrode KE as described with reference to FIG. 3. Step S32 checks whether the electrical signal tapped at the receiving electrode falls below a second threshold value SW2. When the receiving signal tapped at the receiving electrode falls below the second threshold value SW2, a gripping of the hand-held device with one hand is detected. The detection information signal can also be generated in this case and be made available to a microcontroller of the electrical hand-held device for further processing.

After the check according to step S32, the device can change back to the first operating mode BM1 and the method can continue with step S21. As an alternative, the method can also be cancelled or ended after having executed step S32.

In an embodiment of the method according to various embodiments not shown in FIG. 7, the detection can also be omitted in the second operating mode BM2, when the analysis of the receiving signal in the first operating mode BM1 already resulted in a detection of the gripping of the hand-held device.

Figure 8:
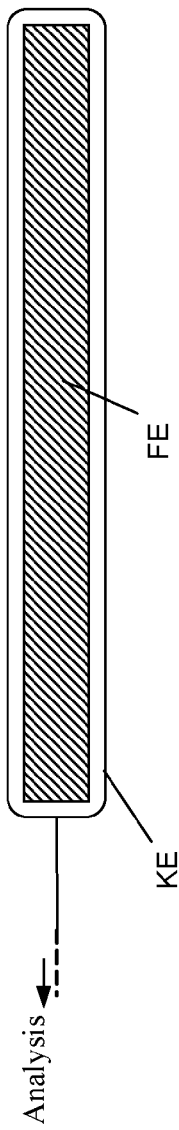
FIG. 8 a possible arrangement of a compensating electrode at a field measuring electrode.

FIG. 8 shows a field measuring electrode FE, which may be provided in addition to the receiving electrode EE. The field measuring electrode FE can also be operated as receiving electrode. In order to be able to detect an approximation to the field measuring electrode substantially regardless of a ground reference, a compensating electrode KE is also assigned to the field measuring electrode FE, which is arranged circumferentially around the field measuring electrode FE. When a gripping of a hand-held device with one hand is detected in the second operating mode, the measuring method can also be used for the field measuring electrode FE in the second operating mode.

Furthermore, an additional compensating electrode may be provided, being assigned to the field measuring electrode FE. A separate signal generator can be provided for this additional compensating electrode in order to apply an alternating electrical signal to the additional compensating electrode. This way, the compensating electrode can be operated substantially regardless of the compensating electrode KE assigned to the receiving electrode EE.

The compensating electrode shown in FIG. 8 must not necessarily be arranged circumferentially around the field measuring electrode FE. It may also be arranged partially circumferentially around the field measuring electrode FE. As an alternative, the compensating electrode may only be arranged at one side of the field measuring electrode FE. The exact arrangement of the compensating electrode relative to the field measuring electrode FE substantially depends on the specific application.

Figure 9:
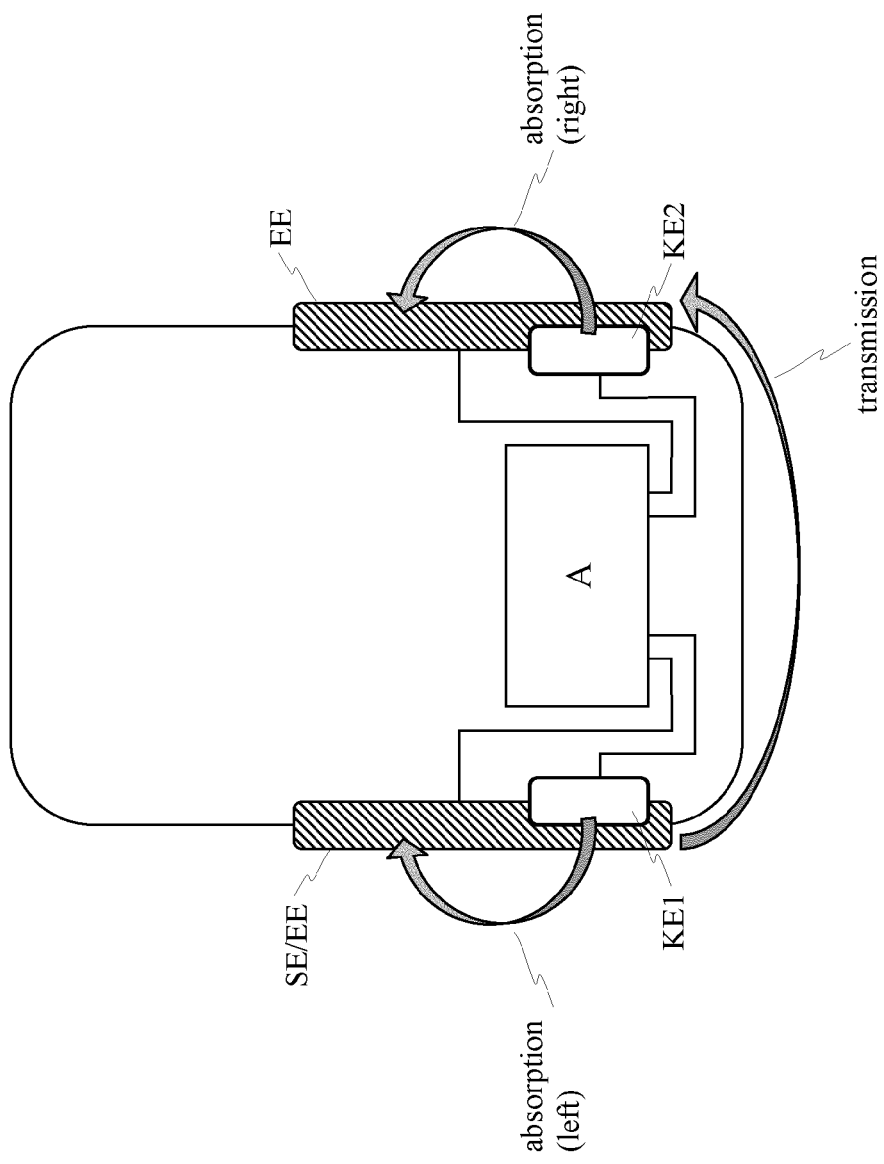
FIG. 9 a schematic illustration of an electrical hand-held device with a capacitive sensor device according to various embodiments, wherein two sensor electrodes are arranged at a left side of the hand-held device and two sensor electrodes are arranged at a right side of the hand-held device.

FIG. 9 shows a schematic illustration of an electrical hand-held device with a capacitive sensor device according to various embodiments, wherein the sensor device, according to the embodiment shown here, comprises four electrodes, namely a transmitting electrode SE, which can be switched to a receiving electrode, a receiving electrode EE and two compensating electrodes KE1 and KE2. The compensating electrodes KE1 and KE2 shown in FIG. 9 correspond to the compensating electrode 1a shown with reference to FIG. 1 or FIG. 2.

In the example shown in FIG. 9 of an electrical hand-held device with a capacitive sensor device according to various embodiments, the transmitting electrode SE and the first compensating electrode KE are arranged at a left side wall of the hand-held device. The receiving electrode EE and the second compensating electrode KE2 are arranged at a right side wall of the hand-held device. Due to the physical separation of the transmitting electrode SE and the receiving electrode EE it is advantageous to configure the compensating electrode KE shown with reference to FIG. 1 and FIG. 2 as two-parts compensating electrode, wherein the first compensating electrode KE1 is arranged physically close to the transmitting electrode SE and the second compensating electrode KE2 is arranged physically close to the receiving electrode EE.

According to an alternative embodiment, the transmitting electrode SE and the receiving electrode EE may also be arranged at a certain physical proximity to one another at the hand-held device so that it may be sufficient to provide only one single compensating electrode KE, which is to be arranged between the transmitting electrode SE and the receiving electrode EE in such a way that the compensating electrode is physically close to the transmitting electrode SE and to the receiving electrode EE in order to generate a certain basic coupling with the transmitting electrode SE as well as with the receiving electrode EE, which is required for the operation of the sensor device in the second operating mode.

FIG. 9 also shows the coupling paths in a transmission mode and in an absorption mode. When the capacitive sensor device is operated in the transmission mode, a capacitive coupling is generated between the receiving electrode SE and the receiving electrode EE via the hand (not shown here) when gripping the hand-held device with one hand. FIG. 9 shows the left electrode SE being operated as transmitting electrode and the right electrode EE being operated as receiving electrode. The reverse situation is also possible, wherein the right electrode EE is operated as transmitting electrode and the left electrode SE is operated as receiving electrode, so that the capacitive coupling path is also generated in reverse direction in the transmission mode.

When the capacitive sensor device is operated in the absorption mode, the transmitting electrode SE as well as the receiving electrode EE are operated as receiving electrodes. An alternating electrical field is emitted at each of the compensating electrodes KE1 and KE2, coupling into the corresponding electrode SE, EE. When gripping the hand-held device with one hand, this affects the capacitive coupling between the two electrodes arranged at the left side of the device as well as the capacitive coupling between the two electrodes arranged at the right side of the device. This way it can be ensured that an approximation to the hand-held device from one side, such as only to the left side of the hand-held device, does not activate the sensor since it only affects one of the two alternating electrical fields generated in the absorption mode. When the capacitive sensor device is operated in the absorption mode, the approximation of a hand to the left electrode pair or to the right electrode pair can be detected as described with reference to FIG. 2b. The gripping of a hand-held device in the transmission mode can be detected as described with reference to FIG. 2a.

According to an embodiment, the capacitive sensor device can be operated in a transmission mode (first operating mode) as well as in an absorption mode (second operating mode). As described before, a gripping of the hand-held device is detected in the transmission mode by analyzing the capacitive coupling between the transmitting electrode SE and the receiving electrode EE via the hand, wherein the gripping of the hand-held device with one hand leads to an increase in level of the electrical signal tapped at the receiving electrode EE.

When the electrical hand-held device has a good ground reference it is possible that a gripping of the hand-held device with one hand does not lead to a significant increase in level of the electrical signal tapped at the receiving electrode EE. Therefore, it is not possible to ensure the detection of a gripping in any case. In order to be still able to reliably and securely detect a gripping of the hand-held device even in case of good ground reference of the electrical hand-held device, various embodiment provide a possibility to bring the sensor device to an absorption mode upon completion of the measurings in the transmission mode, wherein the capacitive coupling ratios are measured at the left electrode pair and at the right electrode pair. In case of a good ground reference of the electrical hand-held device, the approximation of a hand to the electrode pairs has a particularly strong effect so that an approximation leads to a significant level reduction of the electrical signals tapped at the transmitting electrode (being operated as receiving electrode in the absorption mode) and at the receiving electrode EE.

This way, it is advantageously ensured that a gripping of a hand-held device with one hand can be securely and reliably detected in case of a good ground reference as well as in case of a poor ground reference.

Figure 10:
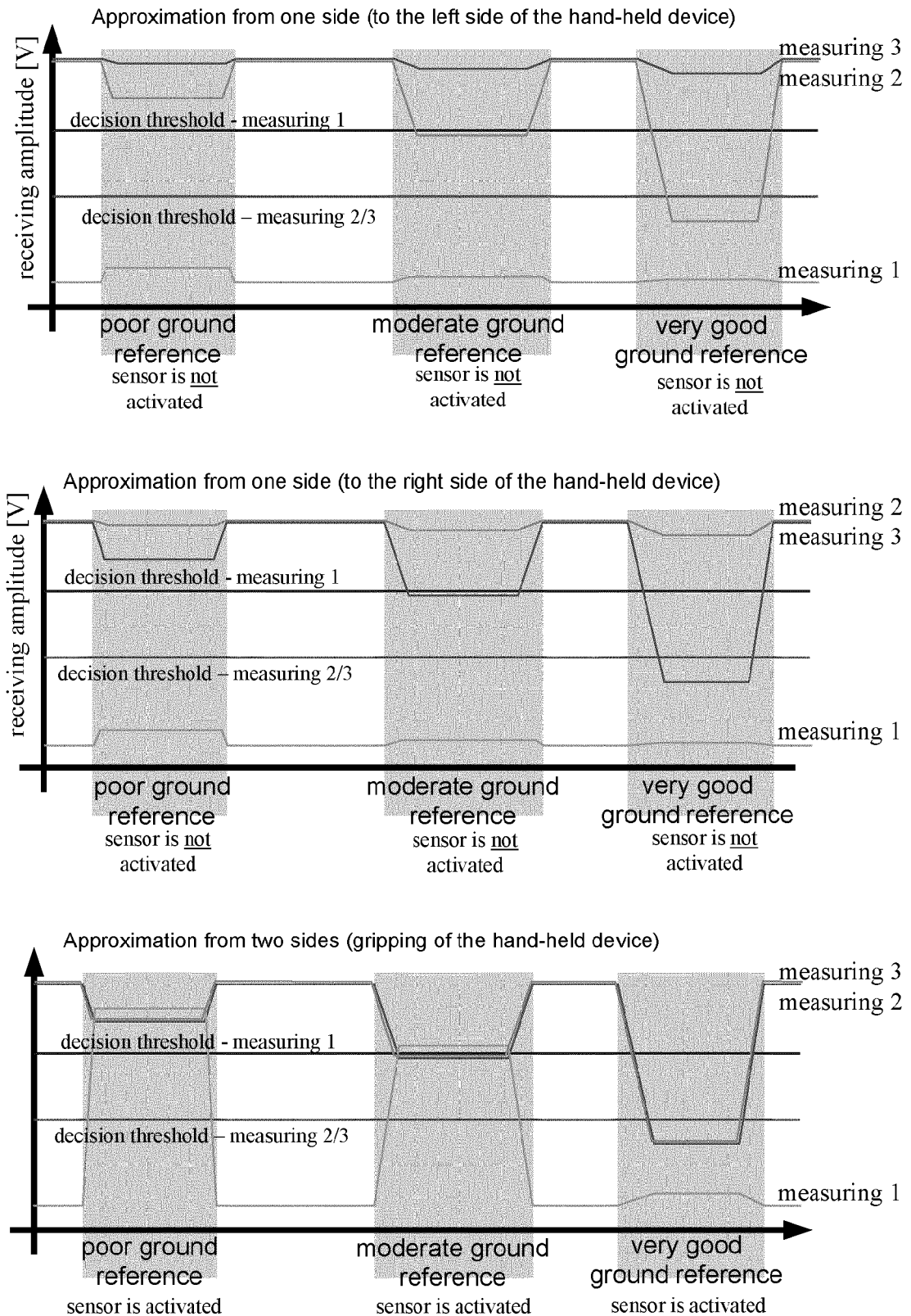
FIG. 10 signal courses of three measuring signals in case of an approximation from one side to the left side of the hand-held device, in case of an approximation from one side to the right side of the hand-held device and in case of an approximation from two sides, i.e. in case of a gripping of the hand-held device, respectively.

FIG. 10 shows signal courses of signals tapped at the corresponding electrodes in the transmission mode and in the absorption mode in case of an approximation from one side to the left side of the hand-held device, in case of an approximation from one side to the right side of the hand-held device and in case of an approximation from two sides, i.e. in case of a gripping of the hand-held device with one hand.

The ground reference of the hand-held device is very poor in the beginning and increases from the left to the right. The signal course "measuring 1" represents the signal course of the first electrical signal tapped at the receiving electrode in the transmission mode, i.e. in the first operating mode. The signal course "measuring 2" represents the signal course of the electrical signal tapped at the left receiving electrode in the absorption mode, i.e. in the second operating mode. The signal course "measuring 3" represents the signal course of the electrical signal tapped at the right receiving electrode in the absorption mode, i.e. in the second operating mode.

Increasing the ground reference of the hand-held device results in a more and more insensitive measuring in the first operating mode, i.e. in the transmission mode, which means that a gripping of the hand-held device with one hand affects the first operating mode increasingly less. This can be seen from the signal course in case of an approximation from one side to the left side of the hand-held device as well as from the signal courses in case of an approximation from one side to the right side of the hand-held device and in case of an approximation from two sides.

The signal deviation of measuring 1 is considerably larger in case of a barely existing ground reference or in case of a very poor ground reference than in case of a moderate ground reference or in case of a very good ground reference of the hand-held device. In the first two signal courses of measuring 1, the appropriate decision threshold with regard to measuring 1 is not exceeded, since virtually no transmission occurs between the transmitting electrode and the receiving electrode. In the third signal course of measuring 1, wherein the hand-held device is gripped with one hand in such a way that the transmitting electrode as well as the receiving electrode are covered, the signal deviation of the signal of measuring 1 is considerably larger and also exceeds the decision threshold assigned to measuring 1.

In case of the measurings (signal courses measuring 2 and measuring 3) performed in the absorption mode, i.e. in the second operating mode, the signal deviation is very small in case of a barely existing ground reference or in case of a very poor ground reference of the hand-held device so that the respective signal does not fall below the decision threshold for measuring 2 and 3 assigned to it. An increasing ground reference also leads to a considerable increase of the signal deviation of the signal levels of measuring 2 and 3 so that the signal levels of the measurings measuring 2 and/or measuring 3 fall below a respectively assigned decision threshold in case of a very good ground reference of the electrical hand-held device.

As can be seen from FIG. 10, only one signal falls below the corresponding decision threshold, respectively, in case of an approximation from one side to the left side of the hand-held device and in case of an approximation from one side to the right side of the hand-held device, wherein both signals fall below the respective decision threshold in case of an approximation from two sides, i.e. in case of a gripping of the hand-held device.

As can be also seen from FIG. 10, a combination of the first operating mode, i.e. the transmission mode, with the second operating mode, i.e. the absorption mode, can considerably improve or ensure a detection of a gripping of a hand-held device, so that in case the hand-held device is actually gripped with a hand, this gripping is recognized as such, simultaneously ensuring that an approximation from one side to the hand-held device does not activate the sensor system. In case of a hand-held device being gripped with one hand, the signal assigned to the measuring 1 exceeds the corresponding decision threshold in case the hand-held device has a very poor ground reference, which leads to an activation of the sensor, wherein the signals of measuring 2 and measuring 3 both fall below a corresponding decision threshold in case the electrical hand-held device has a very good ground reference, also resulting in an activation of the sensor. Due to the fact that only one signal of the measurings 2 and 3 falls below a corresponding decision threshold in case of an approximation from one side, respectively, the sensor is not activated.

Thus, the sensor is activated precisely at that point in time, when the signal of measuring 1 exceeds a corresponding decision threshold or when the signals of measuring 2 and 3 fall below a corresponding decision threshold.

FIG. 10 shows a common decision threshold for the measurings measuring 2 and measuring 3. It is also possible to determine individual decision thresholds for each of the signals of the measurings 2 and 3, wherein the value must fall below said decision thresholds in order to activate the sensor. Different decision thresholds for the measurings 2 and 3 are advantageous in case the arrangement of the electrodes relative to one another at the left side of the hand-held device differs from the arrangement of the electrodes relative to one another at the right side of the hand-held device, or, for example, in case the geometry of the compensating electrode at the left side differs from the geometry of the compensating electrode at the right side of the hand-held device.

Furthermore, it is possible to analyze a sum signal of the electrical signals tapped at the receiving electrodes in the second operating mode, i.e. in the absorption mode. In this case, only one single decision threshold must be provided for the measuring in the absorption mode. The respective decision thresholds can be predetermined or be calculated using an algorithm and changed during operating time.

Figure 11:
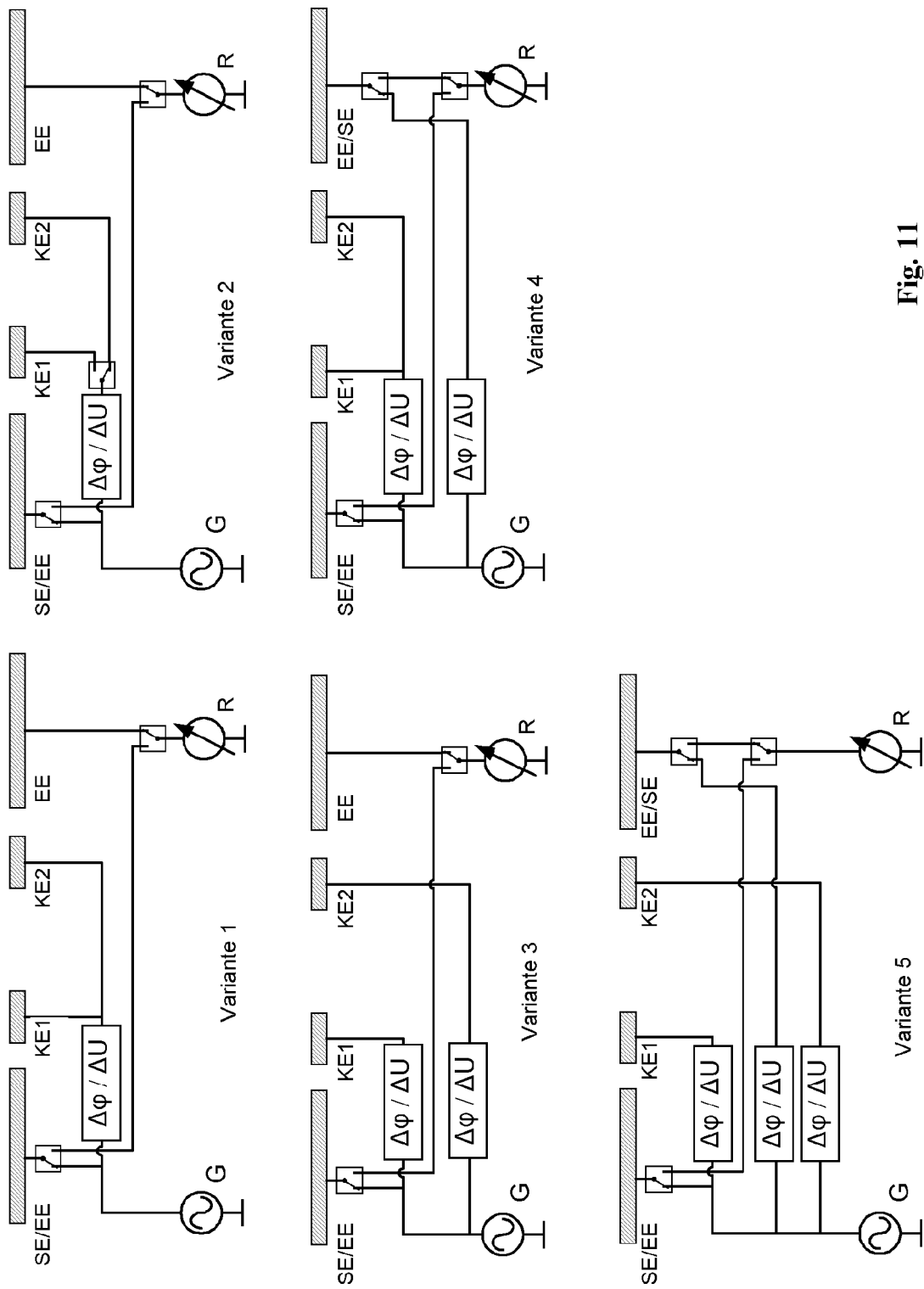
FIG. 11 possible embodiments (variant 1 to variant 5) of a sensor device.

FIG. 11 shows possible embodiments (variant 1 to variant 5) of a sensor device, wherein every variant can be operated in the first operating mode, i.e. the transmission mode, as well as in the second operating mode, i.e. the absorption mode.

A first alternating electrical signal WS1 being provided by a signal generator G is applied to all of the five variants of the transmitting electrode SE in the transmission mode. Thus an alternating electrical field is emitted at the transmitting electrode SE, which couples into the receiving electrode EE via a hand not illustrated here. The capacitive coupling between the transmitting electrode SE and the receiving electrode EE is detected as described with reference to FIG. 2a. In case of variant 4 and variant 5, either the left electrode SE can be operated as transmitting electrode and the right electrode EE can be operated as receiving electrode in the transmission mode, or vice versa.

In the transmission mode, an alternating electrical signal being provided by the signal generator G is also applied to the compensating electrodes KE1, KE2. The alternating electrical signal applied to the compensating electrodes KE1, KE2 may have a different phasing and/or a different amplitude with regard to the alternating electrical signal applied to the transmitting electrode. In case of variant 1, variant 2 and variant 4, the same alternating signal is applied to each of the two compensating electrodes KE1 and KE2, wherein in case of variant 3 and variant 5, the alternating electrical signals applied to the compensating electrodes KE1 and KE2 may have a different phasing and/or different amplitude. The arrangement of the compensating electrodes KE1 and KE2 relative to the transmitting electrode SE and to the receiving electrode EE as well as their influence on the alternating electrical field coupled into the receiving electrode EE correspond to the arrangement as already described with reference to FIG. 1.

The variants 1 and 4 may each also provide a single or individual compensating electrode instead of the two compensating electrodes KE1 and KE2, wherein the arrangement of a single compensating electrode relative to the transmitting electrode and to the receiving electrode is to be selected in such a way that a capacitive coupling between the compensating electrode and the receiving electrode can be generated in the transmission mode and a capacitive coupling not only between the compensating electrode and the transmitting electrode (wherein the transmitting electrode is operated as receiving electrode in the transmission mode) but also between the compensating electrode and the receiving electrode can be generated in the absorption mode.

In the second operating mode, i.e. in the absorption mode, the transmitting electrode SE is operated as receiving electrode EE in all five variants so that an alternating electrical signal is only applied to the compensating electrodes KE1 and KE2. An alternating electrical field is emitted at each of the compensating electrodes KE1, KE2, coupling into the respective receiving electrode assigned to the compensating electrode. For example, the alternating electrical field emitted at the compensating electrode KE1 couples into the left receiving electrode EE and the alternating electrical field emitted at the compensating electrode KE2 couples into the right receiving electrode EE.

In case of variant 1, an alternating electrical signal is simultaneously applied to the two compensating electrodes KE1, KE2, wherein the signals are tapped at the respective receiving electrodes in a multiplexing and are supplied to an analysis device R.

In case of variant 2, an alternating electrical signal is applied to the compensating electrodes in a multiplexing and the signals are tapped at the receiving electrodes in a multiplexing and supplied to an analysis device. As an alternative to the multiplexed tapping of the electrical signals at the receiving electrodes, the receiving electrodes can also be connected in parallel so that a sum signal of the electrical signals tapped at the receiving electrodes is supplied to the analysis device R. The decision threshold for the absorption method is to be set correspondingly. A parallel operation of the receiving electrodes is also possible for the further variants shown with reference to FIG. 11.

In case of variant 3, an alternating signal is simultaneously applied to each of the two compensating electrodes KE1 and KE2, wherein the alternating electrical signal applied to the compensating electrode KE1 may have a different phasing and/or different amplitude with regard to the alternating electrical signal applied to the compensating electrode KE2. The signals at the receiving electrodes are also tapped in a multiplexing and supplied to the analysis device R.

In case of variant 4, an identical alternating electrical signal is applied to the compensating electrodes KE1 and KE2, wherein the signals at the receiving electrodes are, in turn, tapped in a multiplexing. The switching devices arranged between the signal generator G and the two receiving electrodes are substantially provided to optionally operate the left or the right electrode as transmitting electrode and, accordingly, the right or the left electrode as receiving electrode in the transmission mode (first operating mode). This also applies to the embodiment of a capacitive sensor device according to variant 5.

In case of variant 5, an alternating signal is applied to each of the two compensating electrodes KE1 and KE2, wherein the alternating electrical signal may have a different phasing and/or different amplitude. The signals at the receiving electrodes are, in turn, tapped in a multiplexing and supplied to the signal analysis device R.

Variant 5 as well as variant 3 have the advantage that in case of the transmission measuring, the compensating electrode KE1, that is the compensating electrode next to the transmitting electrode SE, can emit a signal comprising the same phasing as the signal emitted at the transmitting electrode and thus enlarges the effective surface of the transmitting electrode. Thus the useful signal stronger couples into the hand, thus generating a better signal-to-noise-ratio in the receiving path.

Figure 12:
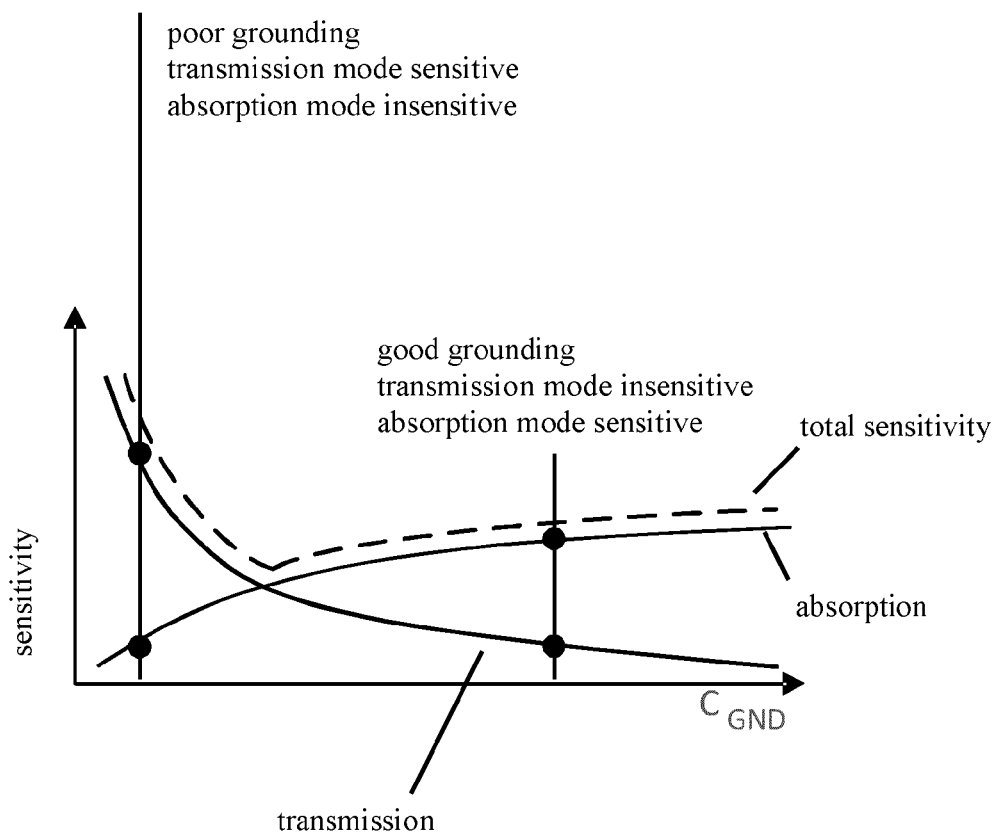
FIG. 12 the course of the sensitivity of a total sensitivity of the capacitive sensor device according to various embodiments when using the transmission method and the absorption method.

FIG. 12 shows a course of the sensitivity of a total sensitivity of the capacitive sensor device according to various embodiments when using the transmission method and the absorption method. FIG. 12 shows the course of the sensitivity of the transmission measuring and the absorption measuring as broken curve. As can be seen from FIG. 12, the total sensitivity of the combined absorption and transmission does not fall below a predetermined value, whereas the total sensitivity when using only the transmission mode or only the absorption mode can be considerable lower, depending on the ground reference of the hand-held device.

A suitable adjustment and analysis enable to set a substantially constant sensitivity of the capacitive sensor regardless of the ground reference of the hand-held device.

Figure 13:
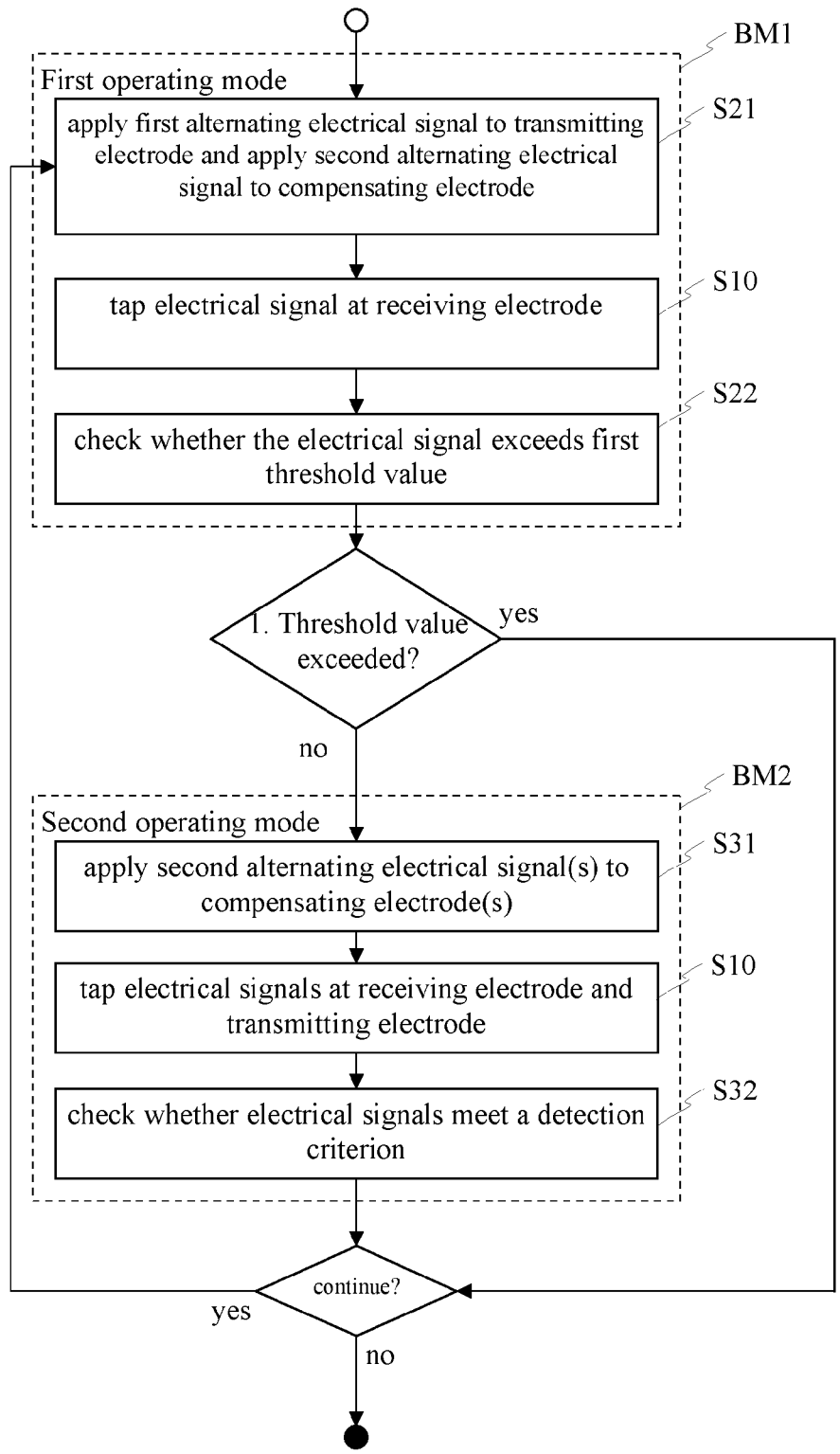
FIG. 13 a flow diagram of the method according to various embodiments for the detection of a gripping of a hand-held device with one hand.

FIG. 13 shows a flow diagram of a method according to various embodiments for the detection of a gripping of a hand-held device with one hand, preferably using a capacitive sensor device according to various embodiments, as described with reference to FIG. 1 to FIG. 11.

An electrical signal is tapped at the receiving electrode EE during the entire measuring (S10). A measuring cycle is substantially divided into two sections, namely a measuring in a first operating mode and measurings in a second operating mode.

First of all, a measuring is performed in a first operating mode BM1, wherein an electrical signal tapped at the receiving electrode is analyzed. In the first operating mode BM1, a first alternating electrical signal is applied to the transmitting electrode and a second alternating electrical signal is applied to the compensating electrode (step S21) as described with reference to FIG. 1. Step S22 checks whether the signal level of the electrical signal tapped at the receiving electrode exceeds a first threshold value SW1. When the signal level exceeds the first threshold value SW1, a detection information signal can be generated, signalizing a gripping of the electrical hand-held device with one hand. The detection information signal can, for example, be made available to a microcontroller of the electrical hand-held device for further processing.

Upon completion of the check according to step S22, the device changes from the first operating mode BM1 to the second operating mode BM2. According to an alternative embodiment of the method according to various embodiments, it is also possible that a change from the first operating mode BM1 to the second operating mode BM2 only takes place when the electrical signal tapped at the receiving electrode in the first operating mode does not exceed the first threshold value. For example, a first threshold value is not exceeded in the first operating mode, when the electrical hand-held device has a very good ground reference, as for example described with reference to FIG. 10. In this case, a change from the first operating mode to the second operating mode makes it possible to perform at least an additional measuring in the second operating mode in order to detect a gripping of the hand-held device by means of the absorption method.

However, when the first threshold value is exceeded in the first operating mode, it can be refrained from changing from the first operating mode to the second operating mode. This has the advantage that no further measurings are required in a second operating mode, provided that a gripping of the hand-held device with one hand has already been detected in the first operating mode BM1, which may lead to a considerable saving of energy and to a shorter response time.

After the change to the second operating mode, the transmitting electrode SE is operated as receiving electrode.

In a step S31 of the second operating mode BM2, a second alternating electrical signal is only applied to the compensating electrode KE or to the compensating electrodes KE1 and KE2, as described with reference to FIG. 2b. In case two compensating electrodes KE1 and KE2 are provided instead of one single compensating electrode KE, an identical alternating electrical signal or alternating electrical signals with a different phasing and/or different amplitude can be applied to them as described with reference to FIG. 11.

Step S32 checks whether the electrical signals tapped at the receiving electrode fall below a second threshold value SW2, respectively. When the electrical signals tapped at the receiving electrode fall below the second threshold value SW2, respectively, a gripping of the hand-held device with one hand is detected. The detection information signal can also be generated in this case and be made available to a microcontroller of the electrical hand-held device for further processing.

The receiving electrodes can also be operated in parallel in the second operating mode, i.e. in the absorption mode, so that only the sum signal of the electrical signals tapped at the receiving electrodes is supplied to an analysis device. It is also possible that a sum signal is generated in the course of the analysis, for example by an analysis device. When using a sum signal it is sufficient to check whether the sum signal falls below a predetermined individual threshold value, as described with reference to FIG. 10.

In a particularly preferred embodiment of the method according to various embodiments, not only a measuring in the first operating mode but also at least a measuring in the second operating mode is performed and a detection information signal is exactly generated once a gripping is detected either in the first operating mode or in the second operating mode, wherein in the second operating mode either both electrical signals tapped at the receiving electrodes each have to fall below a predetermined threshold value or, in case a sum signal of the electrical signals tapped at the receiving electrodes is analyzed, the sum signal falls below a predetermined threshold value.

Upon completion of the check according to step S32, the device can change back to the first operating mode BM1 and the method can continue with step S21. The selection of the repetition rate and possible interconnected sleep cycles may have an influence on the power consumption and the response time. Advantageously, the repetition cycle is set as a function of the detection result and adapts algorithmically. As an alternative, the method can also be cancelled or ended by executing step S32.

Figure 14:
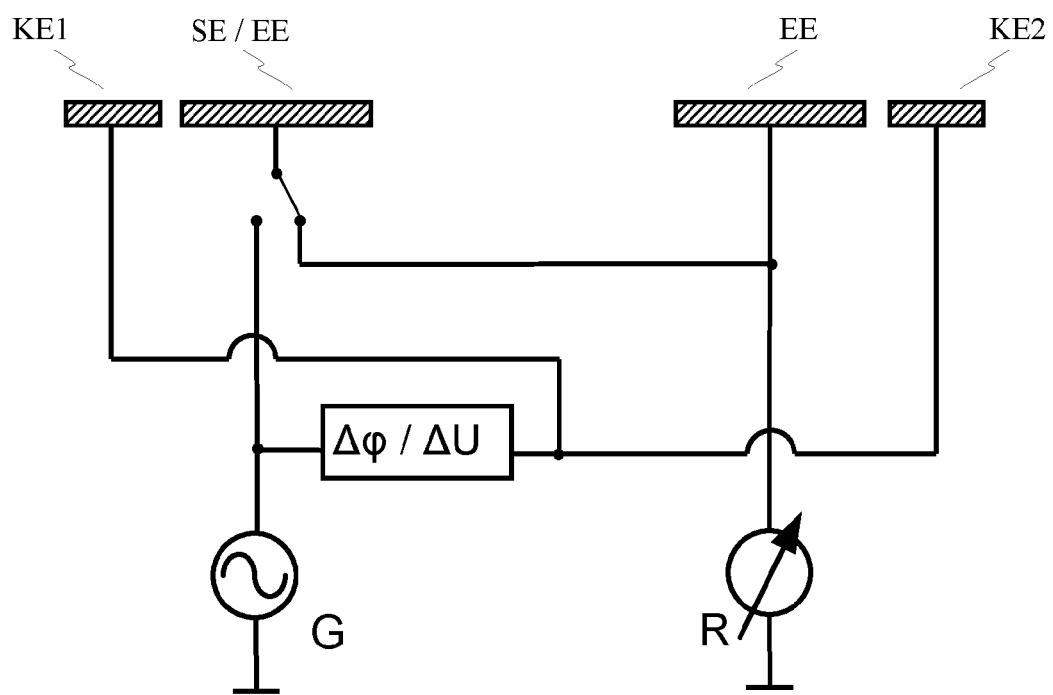
FIG. 14 a further possible embodiment of a sensor device.

FIG. 14 shows a simplified diagram of a sensor device according to various embodiments, wherein the compensating electrodes KE1, KE2 are not arranged between the transmitting electrode SE and the receiving electrode EE. In the embodiment shown here, the transmitting electrode SE and the receiving electrode EE are substantially arranged between the compensating electrodes KE1, KE2, wherein at least the compensating electrode KE1 can be brought into a Capacitive coupling with the transmitting electrode SE and the compensating electrode KE2 can be brought into a capacitive coupling with the receiving electrode EE in the second operating mode BM2. At least the compensating electrode KE2 can be brought into a capacitive coupling with the receiving electrode EE in the first operating mode.

In the second operating mode BM2 (absorption mode), an alternating electrical signal is applied to each of the compensating electrodes KE1 and KE2 so that an alternating electrical field is emitted at each of the compensating electrodes, which couples into the transmitting electrode SE or into the receiving electrode EE. In the second operating mode, the transmitting electrode SE is operated as receiving electrode.

In the embodiment shown in FIG. 14, in addition to that, a sum signal of the electrical signals tapped at the transmitting electrode SE and at the receiving electrode EE is supplied to the receiver R in the second operating mode.

After a gripping of a hand-held device with one hand has been detected in the first operating mode or in the second operating mode, the absorption mode may also be used to detect an approximation of a finger to the left electrode pair KE1, SE and/or to the right electrode pair KE2, EE (compare FIG. 9). As a matter of course, the touch of one or both of the electrode pairs can be detected in addition to the approximation. This makes it possible to provide additional functions. For example, an increase of the display contrast of a cell phone can be assigned to the approximation to the left electrode pair.

The sensor device according to various embodiments can be used in every hand-held device, which requires the detection of a gripping of the hand. A hand-held device, which can be provided with a sensor device according to various embodiments, can be a computer mouse, a remote control for a device, a digital camera, a game controller, a personal digital assistant, a smartphone, a tablet PC or the like. The effect described before when gripping a hand-held device with one hand, for example when gripping the cell phone with one hand, wherein the cell phone comprises a corresponding capacitive sensor device, can also be achieved when the electrical hand-held device is touched with both hands, wherein e.g. a left hand touches the first electrode pair SE, KE1 and a right hand touches the second electrode pair EE, KE2. Thus, the capacitive sensor device according to various embodiments can also be provided for electrical devices which must be operated with two hands, such as a larger tablet PC.

What is claimed is:

1. A method for the detection of a gripping of a hand-held device with one hand, using a sensor device, comprising:
   at least one transmitting electrode, at least one compensating electrode and at least one receiving electrode, wherein
   the sensor device can be operated in a first operating mode and in a second operating mode, the method comprising the steps of:
   selecting the first or second operating mode, wherein
   when operating in the first operating mode: applying a first alternating electrical signal to the transmitting electrode and a second alternating electrical signal to the compensating electrode and
   receiving an electrical signal from the receiving electrode, wherein the gripping of the hand-held device is detected once the electrical signal exceeds a first threshold value, and
   when operating in the second operating mode: applying no signal to the transmitting electrode and applying the second alternating electrical signal to the compensating electrode and
   receiving an electrical signal from the receiving electrode, wherein the gripping of the hand-held device is detected once the electrical signal meets a predetermined detection criterion.

2. A method according to claim 1, wherein in the second operating mode the transmitting electrode is operated as a receiving electrode and the gripping of the hand-held device is detected once an electrical signal tapped at the transmitting electrode meets a predetermined detection criterion.

3. A method according to claim 2, further comprising multiplexing signals received from the transmitting and receiving electrodes for forwarding to an analysis device.

4. A non-transitory computer readable storage medium storing program code which
   when executed on a date processing device or a microprocessor of a hand-held device performs the method according to claim 2.

5. A non-transitory computer readable storage medium storing program code according to claim 4, wherein
   the predetermined detection criterion comprises at least one of the following:

the amount of the electrical signal received at the receiving electrode and the electrical signal received at the transmitting electrode fall below a second threshold value, respectively, and the amount of the sum signal resulting from the electrical signal received at the receiving electrode and the electrical signal received at the transmitting electrode falls below a second threshold value.

6. A method according to claim 1, wherein the predetermined detection criterion comprises falling below a second threshold value.

7. A method according to claim 1, wherein the first alternating electrical signal has a different phase with regard to the second alternating electrical signal and/or the amplitude of the first alternating electrical signal differs from the amplitude of the second alternating electrical signal in the first operating mode.

8. A method according to claim 1, wherein the compensating electrode is configured in several parts and comprises at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode.

9. A method according to claim 8, wherein a third alternating electrical signal is applied to the first compensating electrode and a fourth alternating electrical signal is applied to the second compensating electrode and wherein a different phase and/or different amplitudes with regard to the third alternating electrical signal and the fourth alternating electrical signal are set.

10. A method according to claim 9, wherein the third alternating electrical signal and the fourth alternating electrical signal are applied to the respective compensating electrode in a multiplexing method.

11. A method according to claim 1, wherein the sensor device changes from the first operating mode to the second operating mode in case no gripping of the hand-held device has been detected in the first operating mode.

12. A method according to claim 1, wherein the sensor device cyclically changes from the first operating mode to the second operating mode.

13. A method according to claim 1, wherein the sensor device further comprises at least one field measuring electrode, wherein the at least one field measuring electrode can be arranged relatively to the compensating electrode in such a way that an alternating electrical field emitted at the compensating electrode can couple into the field measuring electrode in the second operating mode.

14. A sensor device for the detection of a gripping of a hand-held device with one hand, comprising
at least one transmitting electrode, at least one compensating electrode, at least one receiving electrode, wherein
the sensor device is configured to apply in a first operating mode a first alternating electrical signal to the transmitting electrode and
a second alternating electrical signal to the compensating electrode and to
detect the gripping of the hand-held device when an electrical signal received from the receiving electrode exceeds a first threshold value, and apply in a second operating mode no signal to the transmitting electrode and apply the second alternating electrical signal to the compensating electrode and to
detect the gripping of the hand-held device when an electrical signal received from the receiving electrode meets a predetermined detection criterion.

15. A sensor device according to claim 14, wherein in the second operating mode the transmitting electrode is operated as a receiving electrode, and the gripping of the hand-held device is detected when an electrical signal tapped at the transmitting electrode meets a predetermined detection criterion.

16. A sensor device according to claim 14, wherein the predetermined detection criterion comprises falling below a second threshold value.

17. A sensor device according to claim 14, further comprising at least one signal generator, which can be coupled with the at least one transmitting electrode and with the at least one compensating electrode to apply the first alternating electrical signal to the transmitting electrode and the second alternating electrical signal to the compensating electrode, wherein a different phase of the second alternating electric signal can be set with respect to the first alternating signal and/or different amplitudes of the first alternating electrical signal and the second alternating electrical signal can be set.

18. A sensor device according to claim 17, wherein a phase shifter or an inverter is arranged between the signal generator and the compensating electrode in order to change a phase of the second alternating electrical signal with regard to the first alternating electrical signal in the first operating mode.

19. A sensor device according to claim 14, wherein the compensating electrode is configured in several parts and comprises at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode.

20. A sensor device according to claim 19, wherein a third alternating electrical signal is applied to the first compensating electrode and a fourth alternating electrical signal is applied to the second compensating electrode, and wherein a different phase and/or different amplitudes with regard to the third alternating electrical signal and the fourth alternating electrical signal can be set.

21. A sensor device according to claim 14, wherein the sensor device is configured to change from the first operating mode to the second operating mode in case no gripping of the hand-held device has been detected in the first operating mode.

22. A sensor device according to claim 14, wherein the sensor device is configured to cyclically change from the first operating mode to the second operating mode.

23. A sensor device according to claim 15, wherein
the predetermined detection criterion comprises at least one of the following
the amount of the electrical signal received at the receiving electrode and the electrical signal received at the transmitting electrode fall below a second threshold value, respectively, and the amount of the sum signal resulting from the electrical signal received at the receiving electrode and the electrical signal received at the transmitting electrode falls below a second threshold value.

24. A sensor device according to claim 14, wherein the second threshold value can be set
as a function of the first threshold value, and/or
as a function of a preset second threshold value.

25. A sensor device according to claim 14, wherein
the transmitting electrode and the receiving electrode are arranged at a distance from one another, and wherein
the compensating electrode is arranged in such a way that it can be brought into a capacitive coupling with the transmitting electrode and the receiving electrode in the second operating mode.

26. A hand-held device according to claim 25, wherein the transmitting electrode is substantially arranged at a first side wall of the hand-held device and the receiving electrode is substantially arranged at a second side wall or on the opposite side from the first side wall.

27. A hand-held device according to claim 25, wherein the compensating electrode is configured in several parts and comprises at least one first compensating electrode and one second compensating electrode, wherein the transmitting electrode, the receiving electrode and the at least one first and second compensating electrodes are arranged relatively to one another in such a way that at least one of said two compensating electrodes can be brought into a capacitive coupling with the receiving electrode in the first operating mode and the first compensating electrode can be brought into a capacitive coupling with the transmitting electrode and the second compensating electrode can be brought into a capacitive coupling with the receiving electrode in the second operating mode.

28. An electrical hand-held device comprising
a sensor device for the detection of a gripping of the hand-held device,
the sensor device comprising at least one transmitting electrode, at least one compensating electrode, and at least one receiving electrode, wherein
the sensor device is configured to select a first or a second operating mode, wherein
when operating in the first operating mode, the sensor device is operable:
to apply a first alternating electrical signal to the transmitting electrode and a second alternating electrical signal to the compensating electrode and
to receive an electrical signal from the receiving electrode, wherein
the gripping of the hand-held device is detected once the electrical signal exceeds a first threshold value, and
when operating in the second operating mode, the sensor device is operable:
to apply no signal to the transmitting electrode and apply the second alternating signal to the compensating electrode and
to receive an electrical signal from the receiving electrode, wherein
the gripping of the hand-held device is detected once the electrical signal meets a predetermined detection criterion.

29. An electrical hand-held device according to claim 28, wherein the transmitting electrode and the receiving electrode are arranged at the hand-held device at a distance from one another, and wherein the compensating electrode is arranged at the hand-held device in such a way that it can be brought into a capacitive coupling with the receiving electrode in the first operating mode and into a capacitive coupling with the transmitting electrode and the receiving electrode in the second operating mode.

* * * * *